US012713615B2

(12) United States Patent
Kim et al.

(10) Patent No.: US 12,713,615 B2
(45) Date of Patent: Aug. 18, 2026

(54) 3D SEMICONDUCTOR MEMORY DEVICE

(71) Applicant: SAMSUNG ELECTRONICS CO., LTD., Suwon-si (KR)

(72) Inventors: Seungyeon Kim, Suwon-si (KR); Chang-Bum Kim, Suwon-si (KR); Hyuckjoon Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 337 days.

(21) Appl. No.: 18/602,749

(22) Filed: Mar. 12, 2024

(65) Prior Publication Data

US 2025/0031377 A1 Jan. 23, 2025

(30) Foreign Application Priority Data

Jul. 20, 2023 (KR) ........................ 10-2023-0094620

(51) Int. Cl.

*H10B 43/40* (2023.01)
*H10B 41/27* (2023.01)
*H10B 41/41* (2023.01)
*H10B 43/27* (2023.01)
*H10B 80/00* (2023.01)
*H10W 90/00* (2026.01)

(52) U.S. Cl.

CPC ............. *H10B 43/40* (2023.02); *H10B 41/27* (2023.02); *H10B 41/41* (2023.02); *H10B 43/27* (2023.02); *H10B 80/00* (2023.02); *H10W 90/00* (2026.01); *H10W 90/792* (2026.01)

(58) Field of Classification Search

CPC ........ H10B 43/40; H10B 41/10; H10B 41/27; H10B 41/41; H10B 43/10; H10B 41/35; H10B 43/35; H10B 41/40; H10B 43/50; H10B 41/50

See application file for complete search history.

(56) References Cited

U.S. PATENT DOCUMENTS

| | | | | |
|---|---|---|---|---|
| 9,466,373 | B2 | 10/2016 | Okada et al. | |
| 11,087,844 | B2 * | 8/2021 | Kim ....................... | G11C 16/10 |
| 11,315,895 | B2 | 4/2022 | Oh | |
| 11,462,275 | B2 | 10/2022 | Kim et al. | |
| 11,488,976 | B2 | 11/2022 | Oh et al. | |

(Continued)

FOREIGN PATENT DOCUMENTS

KR 10-2022-0102778 A 7/2022

*Primary Examiner* — Bac H Au
(74) *Attorney, Agent, or Firm* — Sughrue Mion, PLLC

(57) ABSTRACT

A three-dimensional (3D) semiconductor memory device is provided. The device includes: a memory cell region; and a peripheral circuit configured to control the memory cell region. The memory cell region includes: a cell array region including memory cells arranged vertically along a vertical direction; and a connection region including ends of word lines that are connected to the memory cells, wherein the ends form a stair-step configuration. The peripheral circuit includes a peripheral circuit region overlapping the connection region along the vertical direction. The peripheral circuit region includes a first main pass transistor electrically connected to a first word line of the word lines, and a first dummy pass transistor electrically separated from the word lines. The first main pass transistor and the first dummy pass transistor are arranged along a first direction perpendicular to the vertical direction.

20 Claims, 21 Drawing Sheets

(56) References Cited

U.S. PATENT DOCUMENTS

| | | | | |
|---|---|---|---|---|
| 2019/0043872 | A1* | 2/2019 | Oh | G11C 16/0483 |
| 2020/0388336 | A1* | 12/2020 | Yun | G11C 16/08 |
| 2022/0165744 | A1 | 5/2022 | Kim et al. | |
| 2023/0005947 | A1 | 1/2023 | Yoo et al. | |

* cited by examiner

202b
CT3
CT4
DPT
DSD2
DSD1
DGE
CT3
CT4
DSD2
DSD1
DPT
DGE
CT1
SD1
GE
SD2
CT2
MPT
CT2
SD2
GE
SD1
CT1
MPT
D1
D2
D3

3D SEMICONDUCTOR MEMORY DEVICE

CROSS-REFERENCE TO RELATED APPLICATION

The application claims priority to Korean Patent Application No. 10-2023-0094620, filed on Jul. 20, 2023, in the Korean Intellectual Property Office, the disclosure of which is incorporated by reference herein in its entirety.

BACKGROUND

The present disclosure relates generally to a three-dimensional semiconductor memory device.

To meet demand for excellent performance and affordability, there is a growing need to increase the integration density of semiconductor devices. For two-dimensional or planar semiconductor devices, the integration density is primarily influenced by the region that one memory cell occupies and is consequently highly dependent on the state of micro-pattern formation technologies. However, increasing the fineness of the plurality of patterns requires specialized equipment, which makes the gains in integration density for 2D semiconductor devices incremental and somewhat limited. As a result, there is a need for three-dimensional semiconductor memory devices that feature memory cells arranged in a 3D configuration.

SUMMARY

One or more example embodiments provide a semiconductor memory device with improved reliability.

According to an aspect of an embodiment, a 3D semiconductor memory device includes: semiconductor memory device including: a memory cell region; and a peripheral circuit configured to control the memory cell region. The memory cell region includes: a cell array region including a plurality of memory cells arranged vertically along a vertical direction; and a connection region including ends of a plurality of word lines that are connected to the plurality of memory cells, wherein the ends form a stair-step configuration. The peripheral circuit includes a peripheral circuit region overlapping the connection region along the vertical direction. The peripheral circuit region includes a first main pass transistor electrically connected to a first word line of the plurality of word lines, and a first dummy pass transistor electrically separated from the plurality of word lines. The first main pass transistor and the first dummy pass transistor are arranged along a first direction perpendicular to the vertical direction.

According to an aspect of an embodiment, a 3D semiconductor memory device includes: a memory cell region; and a peripheral circuit configured to control the memory cell region. The memory cell region includes: a cell array region including a plurality of memory cells arranged along a vertical direction; and a connection region including ends of a plurality of word lines that are connected to the plurality of memory cells. The peripheral circuit includes a peripheral circuit region overlapping the connection region along the vertical direction. The peripheral circuit region includes a plurality of main pass transistors electrically connected to the plurality of word lines, and a plurality of dummy pass transistors electrically separated from the plurality of word lines. The plurality of main pass transistors is arranged along a first direction perpendicular to the vertical direction.

According to an aspect of an embodiment, a 3D semiconductor memory device includes: a memory cell region; and a peripheral circuit region configured to control the memory cell region. The memory cell region includes a plurality of blocks. Each of the plurality of blocks includes a cell array region including: a plurality of memory cells arranged along a vertical direction; and a connection region including ends of a plurality of word lines that are connected to the plurality of memory cells. The peripheral circuit region includes peripheral circuit regions overlapping, respectively, with the connection region of the plurality of blocks. Each of the peripheral circuit regions includes a plurality of main pass transistors electrically connected to the plurality of word lines, and a plurality of dummy pass transistors electrically separated from the plurality of word lines. The plurality of main pass transistors is arranged along a first direction perpendicular to the vertical direction.

Additional aspects will be set forth in part in the description which follows and, in part, will be apparent from the description, or may be learned by practice of example embodiments.

BRIEF DESCRIPTION OF DRAWINGS

The above and other aspects, features, and advantages will be more apparent from the following description of example embodiments, taken in conjunction with the accompanying drawings, in which.

DETAILED DESCRIPTION

Figure 1A:
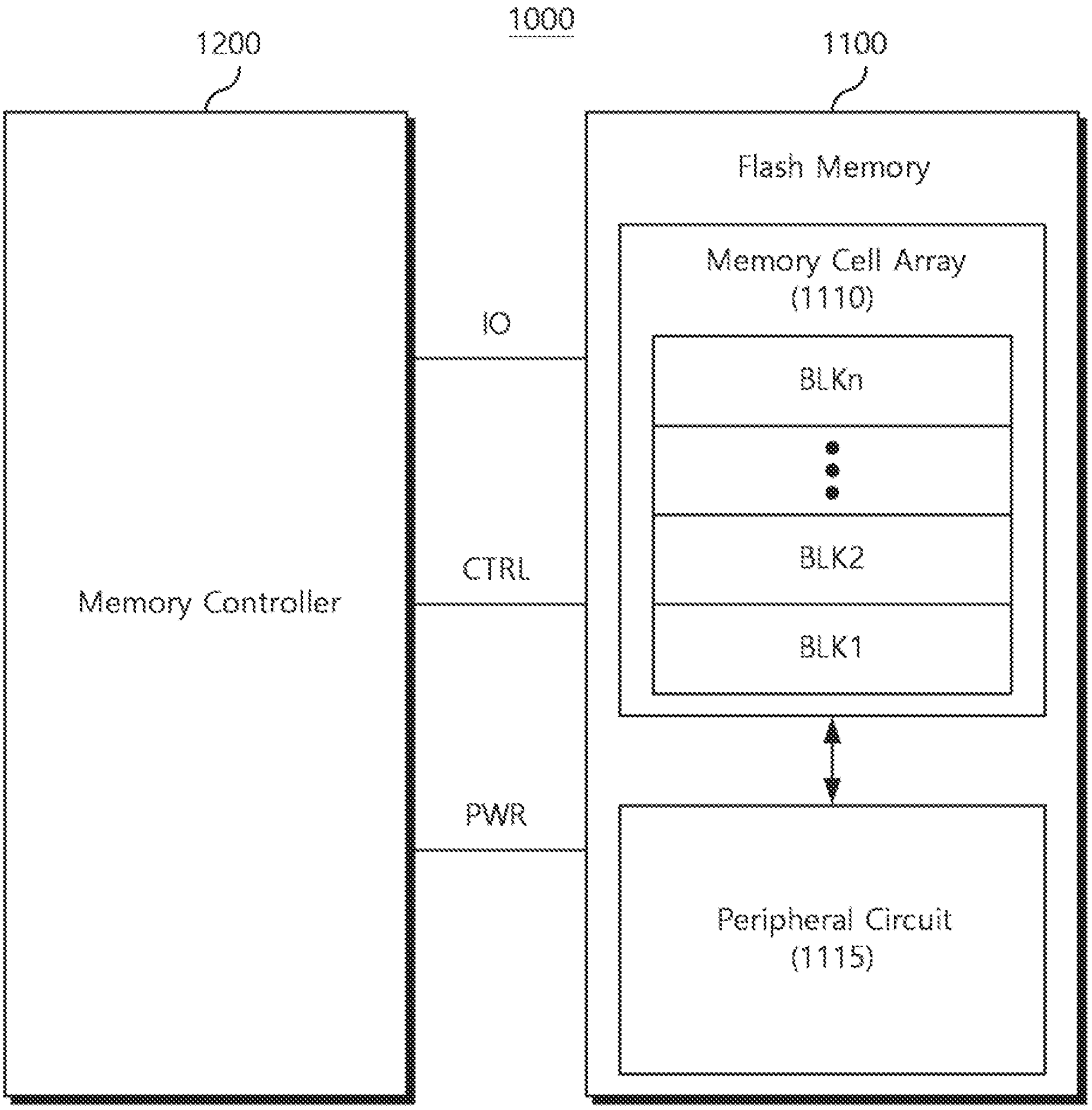
FIG. 1A is a block diagram illustrating a storage device including a semiconductor memory device according to some example embodiments.

Hereinafter, example embodiments are described in detail with reference to the accompanying drawings. Like components are denoted by like reference numerals throughout the specification, and repeated descriptions thereof are omitted. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Embodiments described herein are example embodiments, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be also understood that, even if a certain step or operation of manufacturing an apparatus or structure is described later than another step or operation, the step or operation may be performed later than the other step or operation unless the other step or operation is described as being performed after the step or operation.

FIG. 1A is a block diagram illustrating a storage device including the semiconductor memory device.

Referring to FIG. 1A, the storage device 1000 may be a flash storage device based on the flash memory 1100. For example, the storage device 1000 may be a solid-state drive (SSD), a Universal Flash Storage (UFS), or a memory card.

The storage device 1000 includes a flash memory 1100 and a memory controller 1200. The flash memory 1100 and the memory controller 1200 may be connected through data input/output lines IO, control line CTRL, and power supply lines PWR. The storage device 1000 may store data in the flash memory 1100 under the control of the memory controller 1200.

The flash memory 1100 may include a memory cell array 1110 and a peripheral circuit 1115. The memory cell array 1110 may include a plurality of memory blocks BLK1 to BLKn. Each memory block may have a vertical 3D structure. Each memory block may include a plurality of memory cells. In one example embodiment, multi-bit data may be stored in each memory cell.

The memory cell array 1110 may be positioned next to or above the peripheral circuit 1115 in terms of the design layout structure. A structure in which the memory cell array 1110 is positioned over the peripheral circuit 1115 is referred to as a cell on peripheral (COP) structure. The memory cell array 1110 may be manufactured as a chip separate from the peripheral circuit 1115. An upper chip including the memory cell array 1110 and a lower chip including the peripheral circuit 1115 may be connected to each other by a bonding method. Such a structure is called a C2C (chip to chip) structure.

The peripheral circuit 1115 may include analog circuits or digital circuits used to store data in the memory cell array 1110 or read data stored in the memory cell array 1110. The peripheral circuit 1115 may receive external power (PWR) from the memory controller 1200 and generate internal power (e.g., Vcc) of various levels.

The peripheral circuit 1115 may receive commands, addresses, and data from the memory controller 1200 through the input/output lines IO. The peripheral circuit 1115 may store data in the memory cell array 1110 according to control of the control signals CTRL. Also, the peripheral circuit 1115 may read data stored in the memory cell array 1110 and provide the data to the memory controller 1200.

Figure 1B:
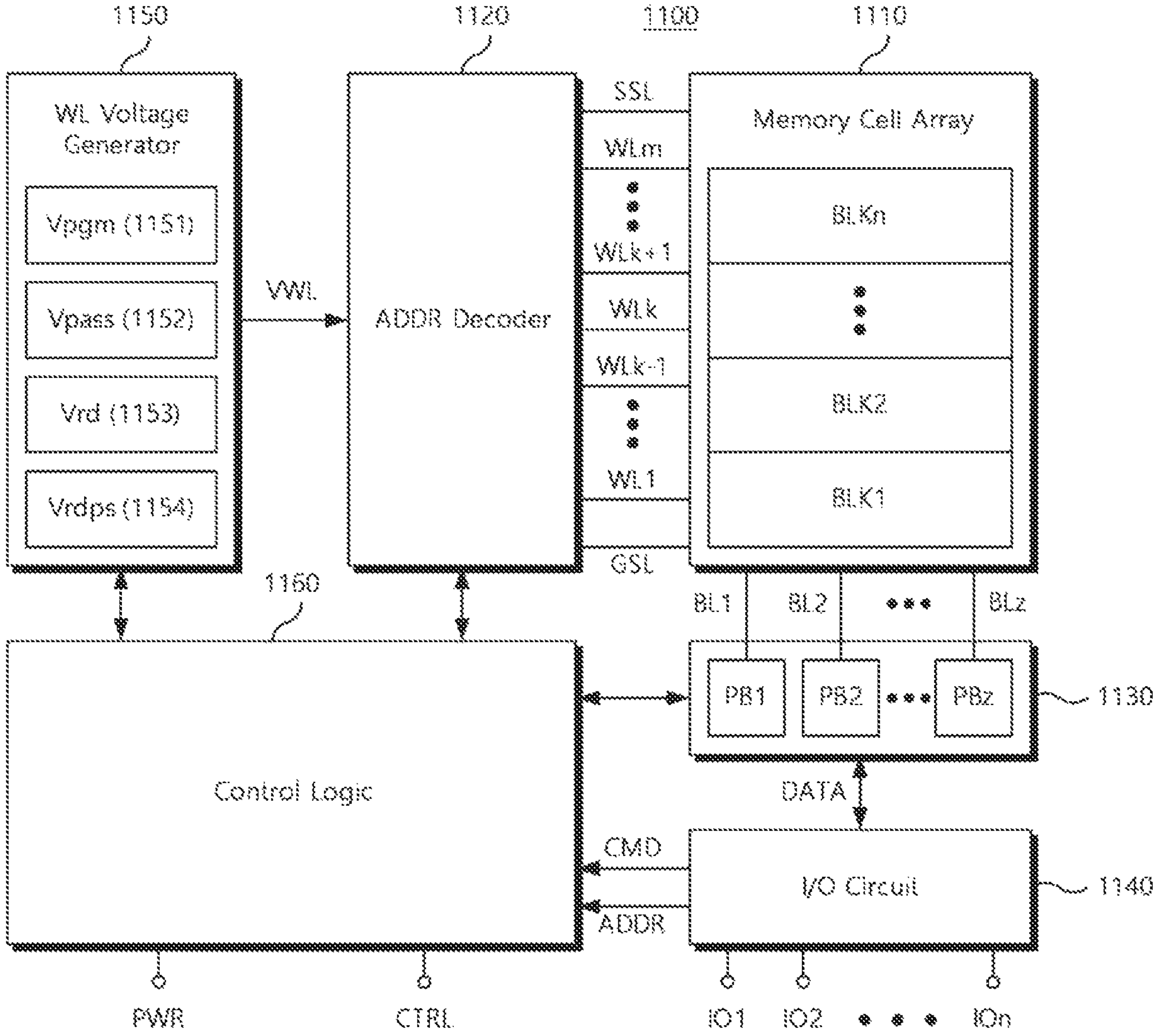
FIG. 1B is a block diagram illustrating a flash memory according to some example embodiments.

FIG. 1B is a block diagram of a flash memory, such as the flash memory illustrated in FIG. 1A, according to some example embodiments.

Referring to FIG. 1B, a flash memory 1100 includes a memory cell array 1110, an address decoder 1120, a page buffer circuit 1130, a data input/output circuit 1140, a word line voltage generator 1150, and a control logic 1160.

The memory cell array 1110 may include a plurality of memory blocks BLK1 to BLKn. Each memory block may be composed of a plurality of pages. Each page may include a plurality of memory cells. Multi-bit data may be stored in each memory cell. Each memory block is an erase unit, and each page may be a read or write unit.

The memory cell array 1110 may be formed in a direction perpendicular to the substrate. A gate electrode layer and an insulation layer may be alternately deposited on the substrate. Each memory block (e.g., BLK1) may be connected to a string selection line SSL, a plurality of word lines WL1 to WLm, and a ground selection line GSL.

The address decoder 1120 may be connected with the memory cell array 1110 through the selection lines SSL and GSL, and the word lines WL1 to WLm. The address decoder 1120 may select a word line in the program or read operation. The address decoder 1120 may receive a word line voltage VWL from the word line voltage generator 1150 and may provide the selected word line with the program voltage or the read voltage.

The page buffer circuit 1130 may be connected with the memory cell array 1110 through bit lines BL1~BLz. The page buffer circuit 1130 may temporarily store data to be programmed in the memory cell array 1110 or data read from the memory cell array 1110. The page buffer circuit 1130 may include page buffers PB1~PBz that are connected with each bit lines BLs. Each page buffer may include a plurality of latches for the purpose of storing or reading multi-bit data.

The data input/output circuit 1140 may be internally connected with the page buffer circuit 1130 through data lines and may be externally connected with the memory controller 1200 (refer to FIG. 1A) through input/output lines IO1 to IOn. During the program operation, the data input/output circuit 1140 may receive program data from the memory controller 1200. During the read operation, the data input/output circuit 1140 may provide the memory controller 1200 with data read from the memory cell array 1110.

The word line voltage generator 1150 may be supplied with an internal power from the control logic 1160 and may generate the word line voltage VWL used to read or write data. The word line voltage VWL may be provided to a selected word line sWL or unselected word lines uWL through the address decoder 1120.

The word line voltage generator 1150 may include a program voltage generator 1151 and a pass voltage generator 1152. The program voltage generator 1151 may generate a program voltage Vpgm provided to the selected word line sWL during a program operation. The pass voltage generator 1152 may generate a pass voltage Vpass provided to the selected word line sWL and the unselected word line uWL.

The word line voltage generator 1150 may include a read voltage generator 1153 and a read pass voltage generator 1154. The read voltage generator 1153 may generate the select read voltage Vrd provided to the select word line sWL during a read operation. The read pass voltage generator 1154 may generate a read pass voltage Vrdps provided to the unselected word line uWL. The read pass voltage Vrdps may be a voltage sufficient to turn on memory cells connected to the unselected word line uWL during a read operation.

The control logic 1160 may control the program, read, and erase operations of the flash memory device 1100 by using a command CMD, an address ADDR, and the control signal CTRL provided from the memory controller 1200. The address ADDR may include a block address (or block selection address) that indicates, and may be used for selecting, one memory block, and a row address and a column address that indicate, and may be used for selecting, one memory cell of the selected memory block.

Figure 1C:
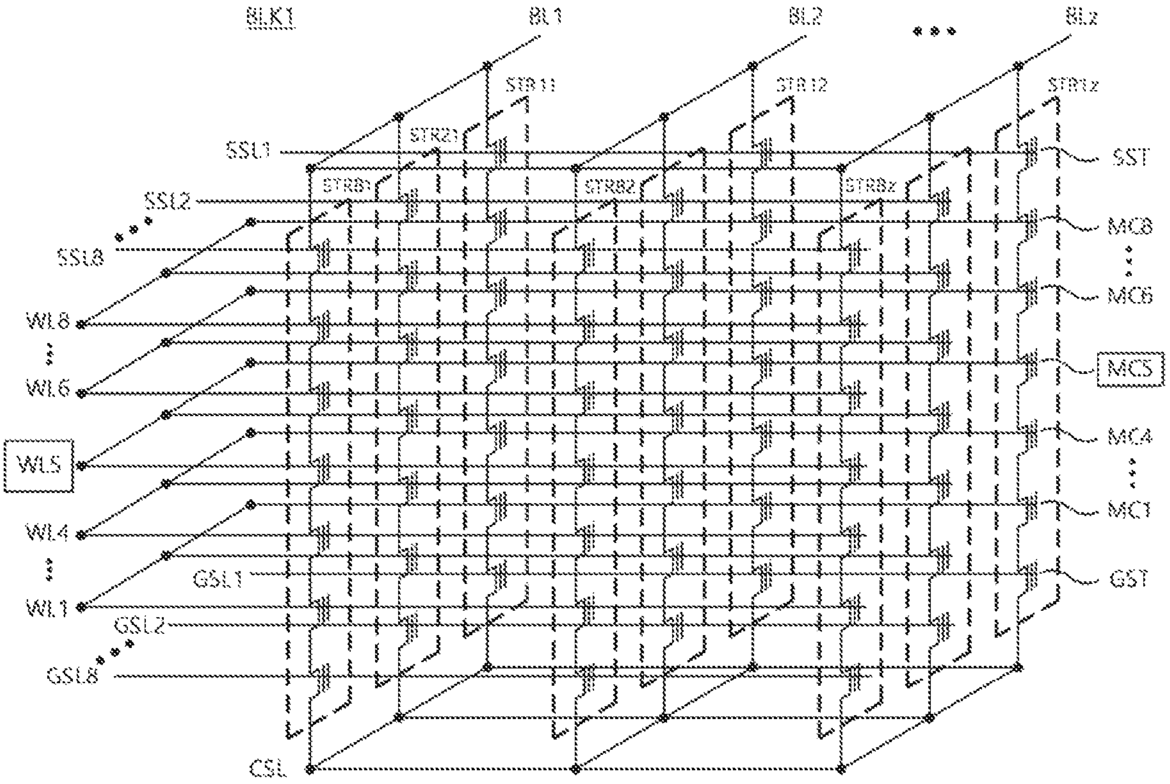
FIG. 1C is a circuit diagram illustrating a memory block of a memory cell array according to some example embodiments.

FIG. 1C is a circuit diagram illustrating a memory block BLK1 of a memory cell array, such as the memory cell array illustrated in FIG. 1B, according to some example embodiments.

Referring to FIG. 1C, in the memory block BLK1, a plurality of cell strings STR11 to STR8*z* may be formed between the bit lines BL1 to BLz and a common source line CSL. Each cell string includes a string selection transistor SST, a plurality of memory cells MC1 to MC8, and a ground selection transistor GST. However, the number of cell strings and the number of memory cells included in each cell string may be determined as needed.

The string selection transistors SST may be connected with string selection lines SSL1 to SSL8. The ground selection transistors GST may be connected with ground selection lines GSL1 to GSL8. The string selection transistors SST may be connected with the bit lines BL1 to BLz, and the ground selection transistors GST may be connected with the common source line CSL.

The first to eighth word lines WL1 to WL8 may be connected with the plurality of memory cells MC1 to MC8 in a row direction. The first to z-th bit lines BL1 to BLz may be connected with the plurality of memory cells MC1 to MC8 in a column direction. First to z-th page buffers PB1 to PBz may be connected with the first to z-th bit lines BL1 to BLz.

The first word line WL1 may be placed above the first to eighth ground selection lines GSL1 to GSL8. The first memory cells MC1 that are placed at the same height from the substrate may be connected with the first word line WL1. Likewise, the second to eighth memory cells MC2 to MC8 that are placed at the same heights from the substrate may be respectively connected with the second to eighth word lines WL2 to WL8.

Figure 1D:
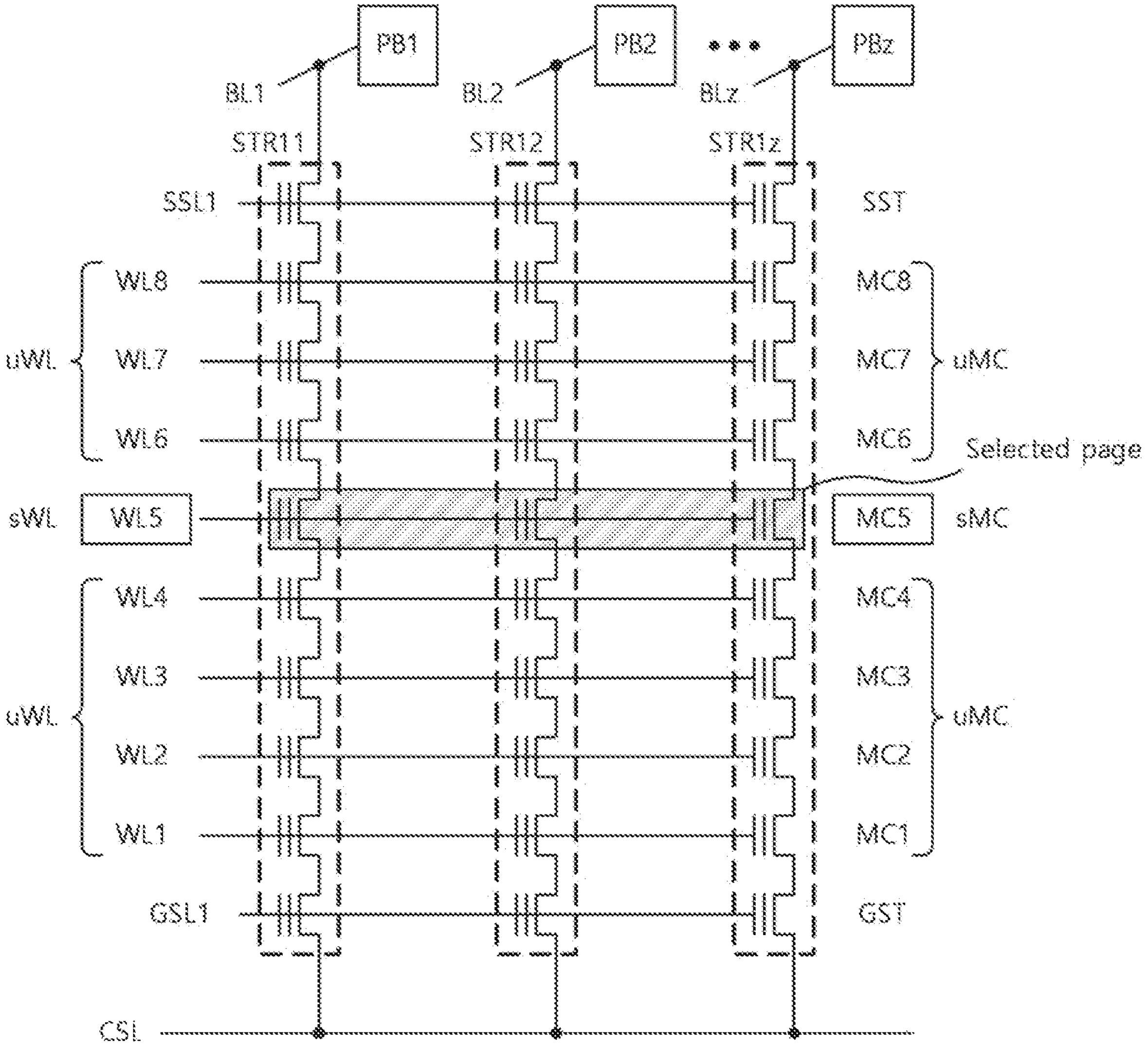
FIG. 1D is a circuit diagram illustrating cell strings selected by first string selection line SSL1 according to some example embodiments.

FIG. 1D is a circuit diagram of cell strings selected by a first string selection line SSL1 from among cell strings of the memory block BLK1 according to some example embodiments. The 1-1st to 1-z-th cell strings STR11 to STR1*z* may be selected by the first string selection line SSL1. The 1-1st to 1-z-th cell strings STR11 to STR1*z* may be respectively connected with the first to z-th bit lines BL1 to BLz. First to z-th page buffers PB1 to PBz may be respectively connected with the first to z-th bit lines BL1 to BLz.

The 1-1st cell string STR11 is connected with the first bit line BL1 and the common source line CSL. The string selection transistor SST selected by the first string selection line SSL1, the first to eighth memory cells MC1 to MC8 connected with the first to eighth word lines WL1 to WL8, and the ground selection transistors GST selected by the first ground selection line GSL1 may be included in the 1-1st cell string STR11. Likewise, the 1-2nd cell string STR12 may be connected with the second bit line BL2 and the common source line CSL, and the 1-z-th cell string STR1*z* may be connected with the z-th bit line BLz and the common source line CSL.

The first to fourth word lines WL1 to WL4 and the sixth to eight word lines WL6 to WL8 may be unselected word lines uWL. The fifth word line WL5 may be the selected word line sWL. The first to fourth memory cells MC1 to MC4 and the sixth to eight memory cells MC6 to MC8 may be unselected memory cells uMC. The fifth memory cell MC5 may be a selected memory cell sMC.

Memory cells that are selected by one string selection line in one memory block and are connected with one word line may constitute one page. For example, the fifth memory cells MC5 that is selected by the first string selection line SSL1 in the memory block BLK1, and is connected with the fifth word line WL5 may constitute one page. In some example embodiments, eight pages may be implemented by using the memory cells connected with the fifth word line WL5 connected to one bit line. Among the eight pages, the page connected with the first string selection line SSL1 may be a selected page. However, example embodiments are not limited thereto, and more or fewer pages may be used.

Figure 2A:
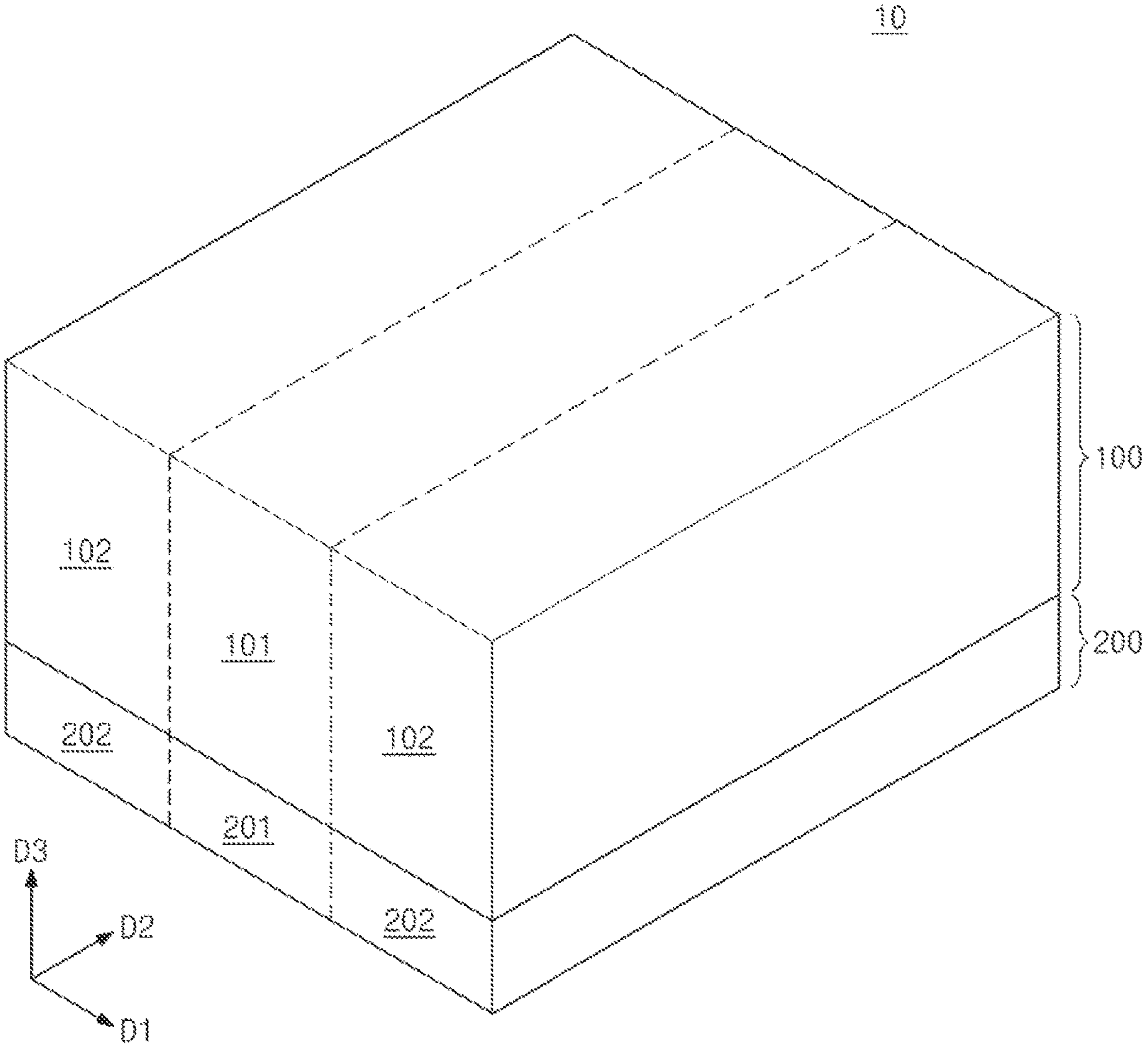
FIG. 2A is a conceptual diagram of a semiconductor memory device according to some example embodiments.
Figure 2B:
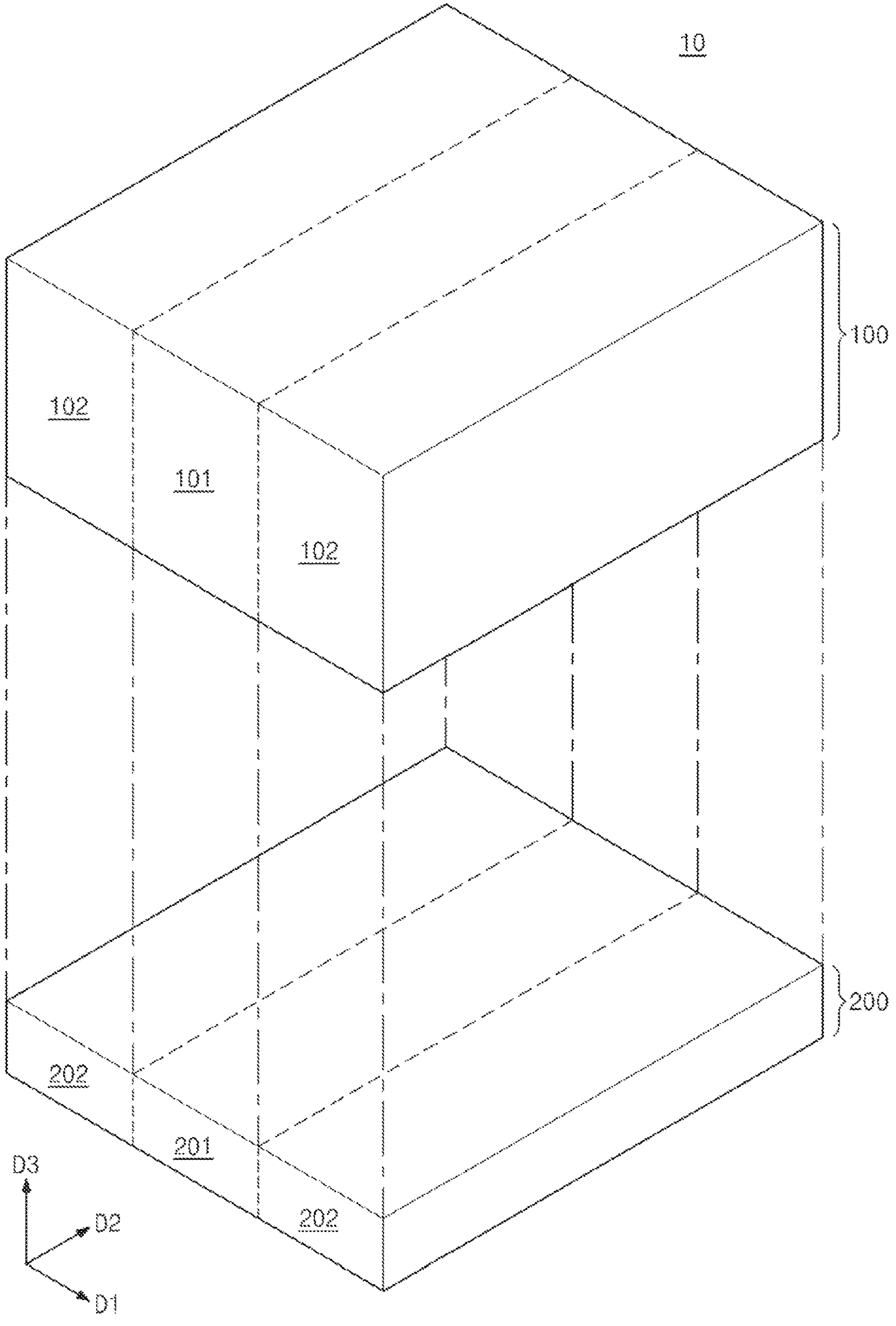
FIG. 2B is a diagram of a memory cell region and a peripheral circuit region according to some example embodiments.
Figure 3:
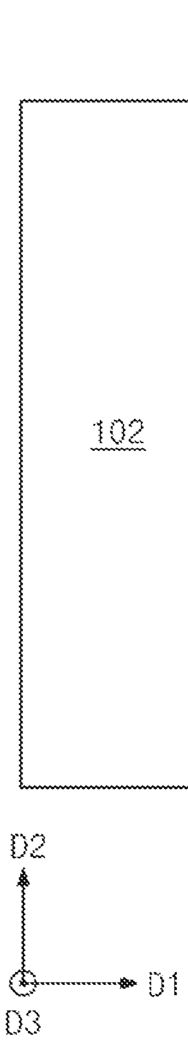
FIG. 3 is a plan view of the memory cell region according to some example embodiments.
Figure 4:
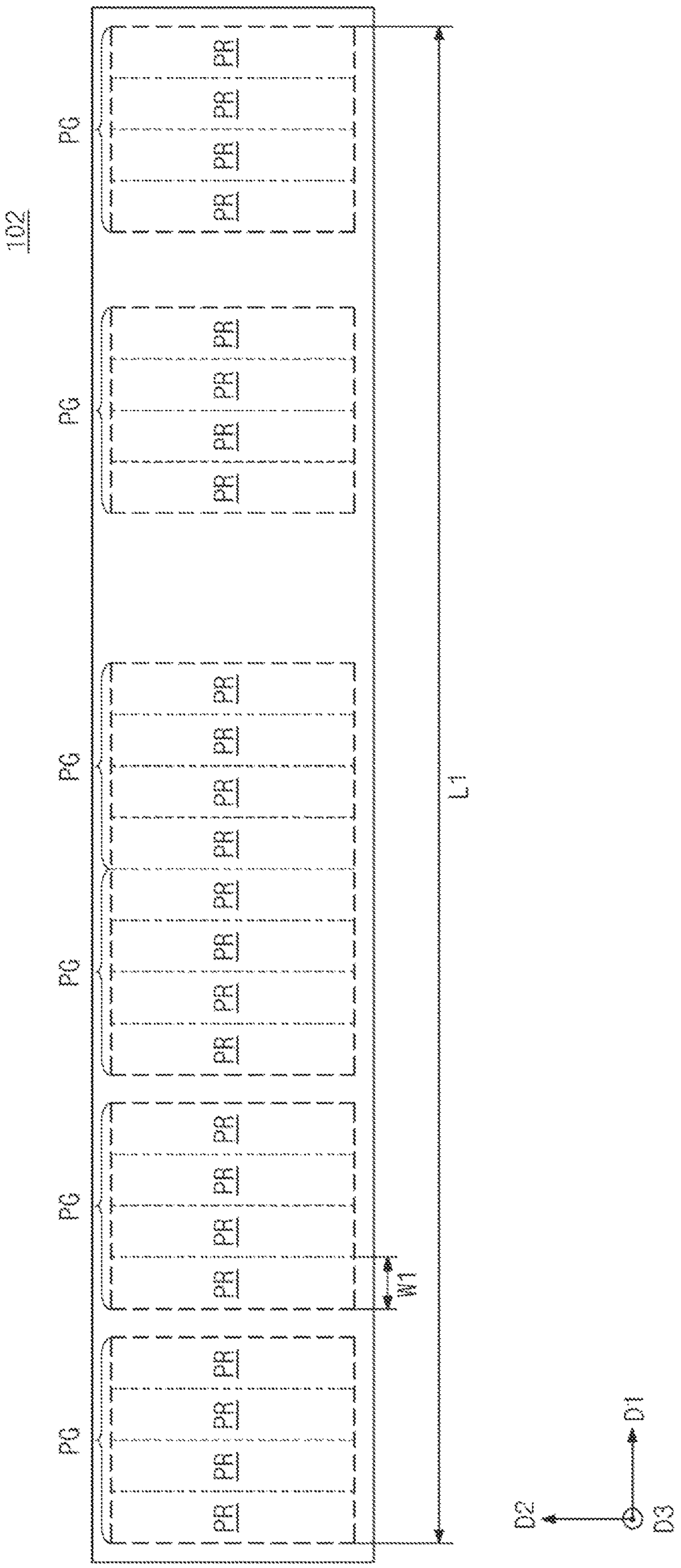
FIG. 4 is a diagram of a connection region included in one block according to some example embodiments.
Figure 5:
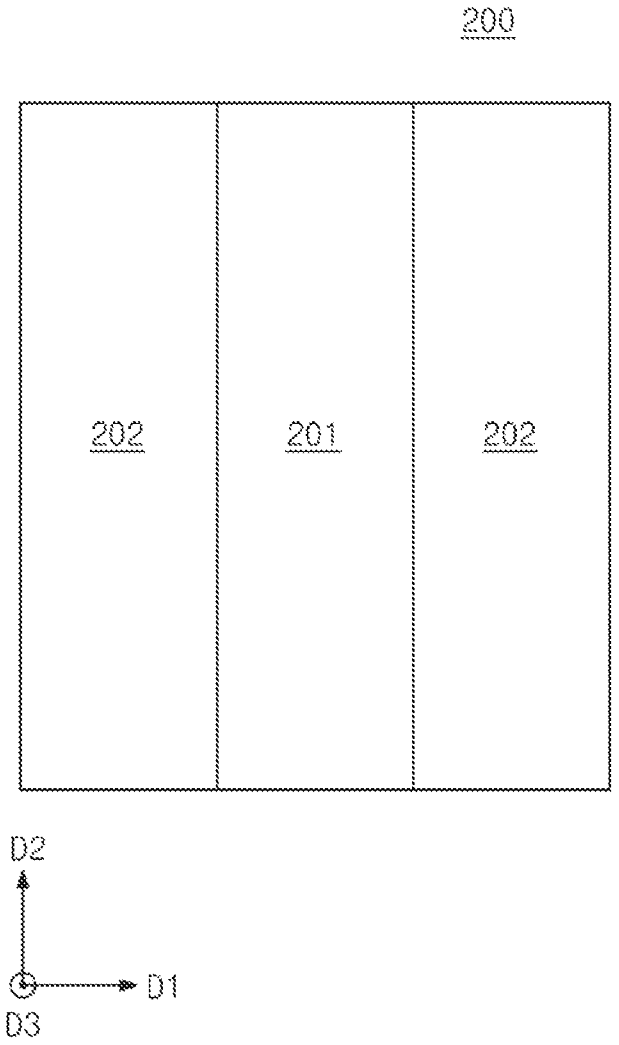
FIG. 5 is a plan view of a peripheral circuit region according to some example embodiments.
Figure 6A:
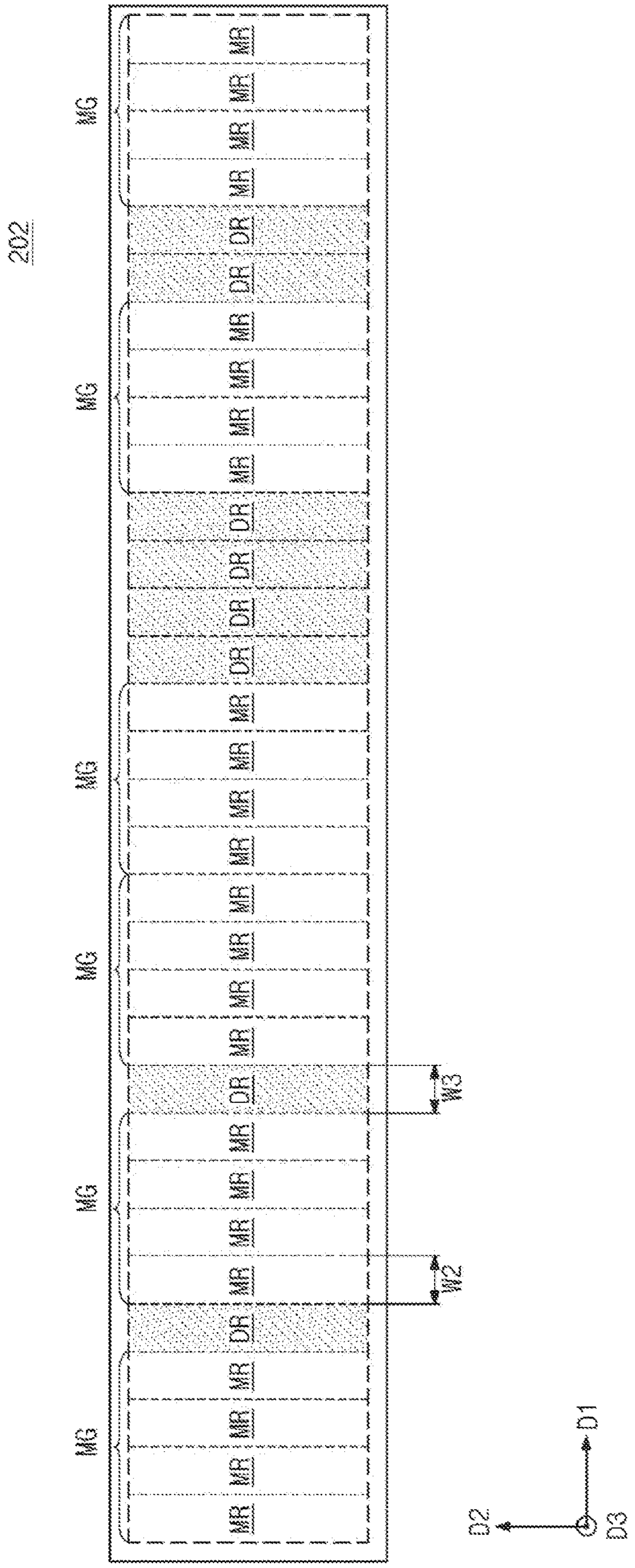
FIGS. 6A and 6B are diagrams of a second peripheral circuit region included in one block according to some example embodiments.
Figure 6B:
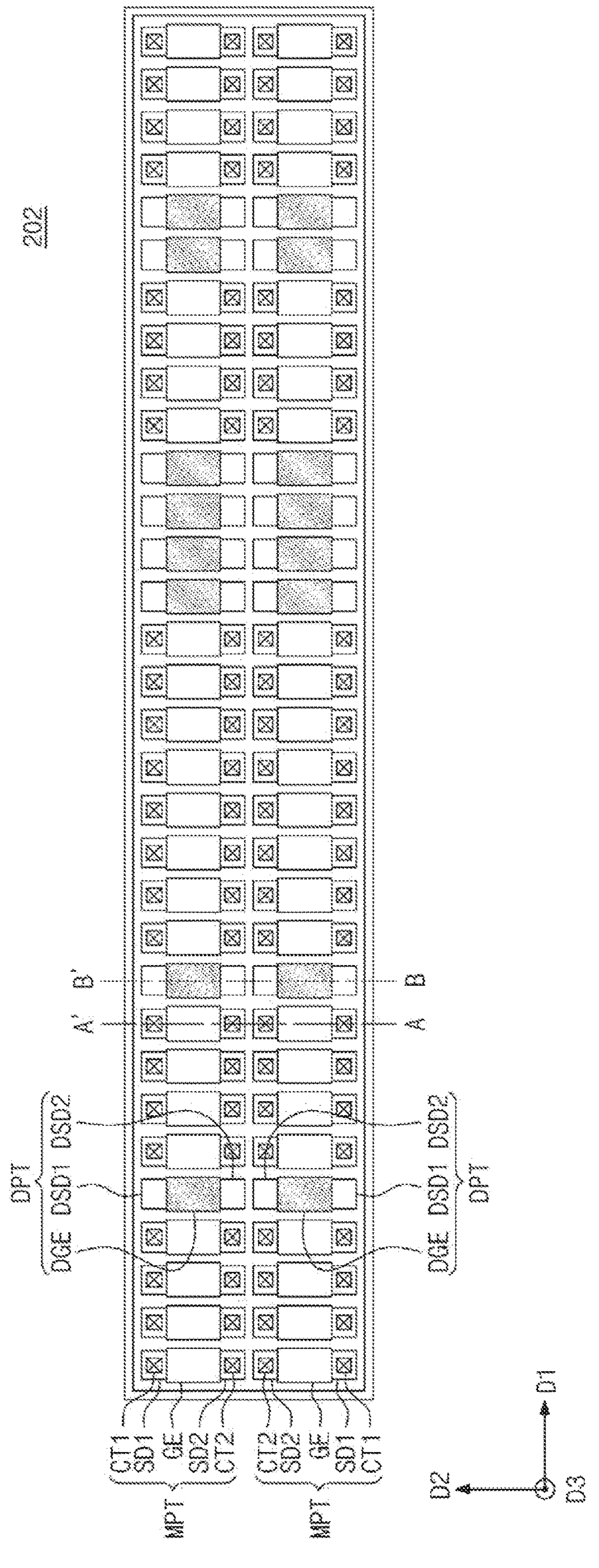
Figure 6C:
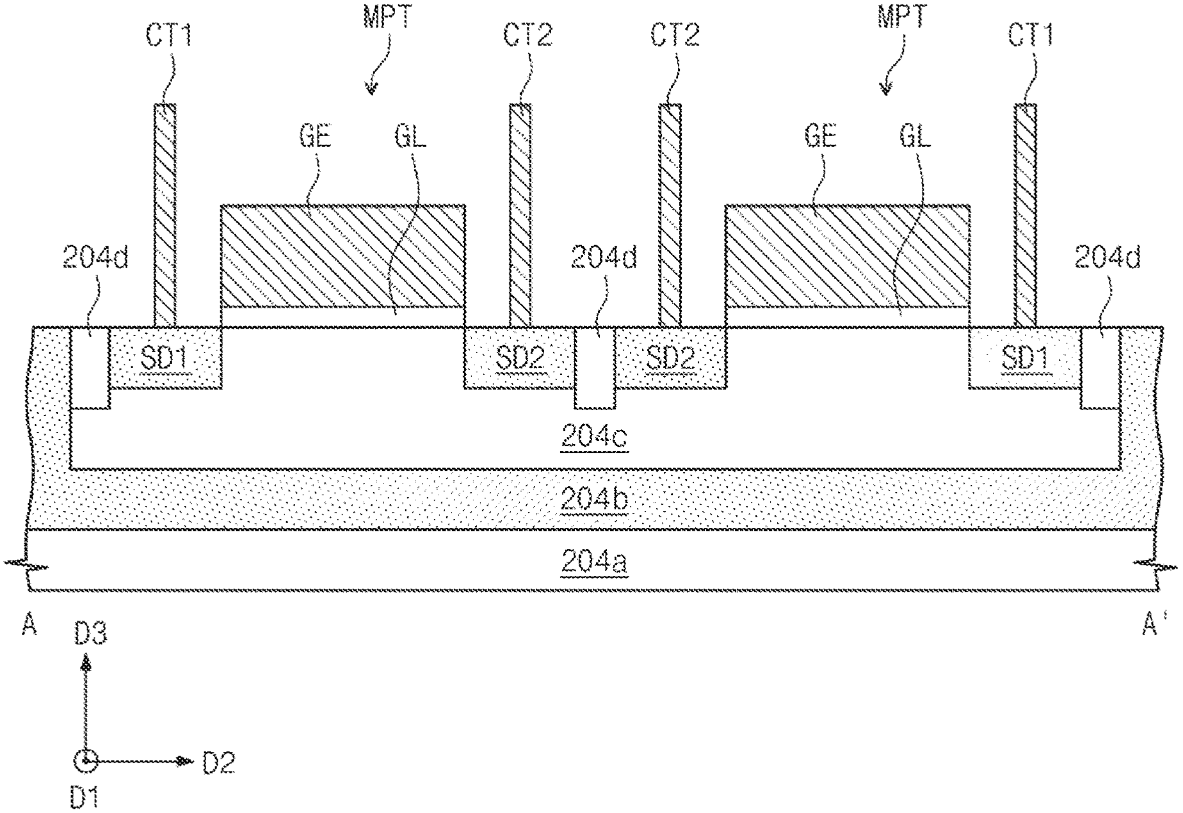
FIG. 6C is a cross-sectional view of a second peripheral circuit region according to some example embodiments.
Figure 6D:
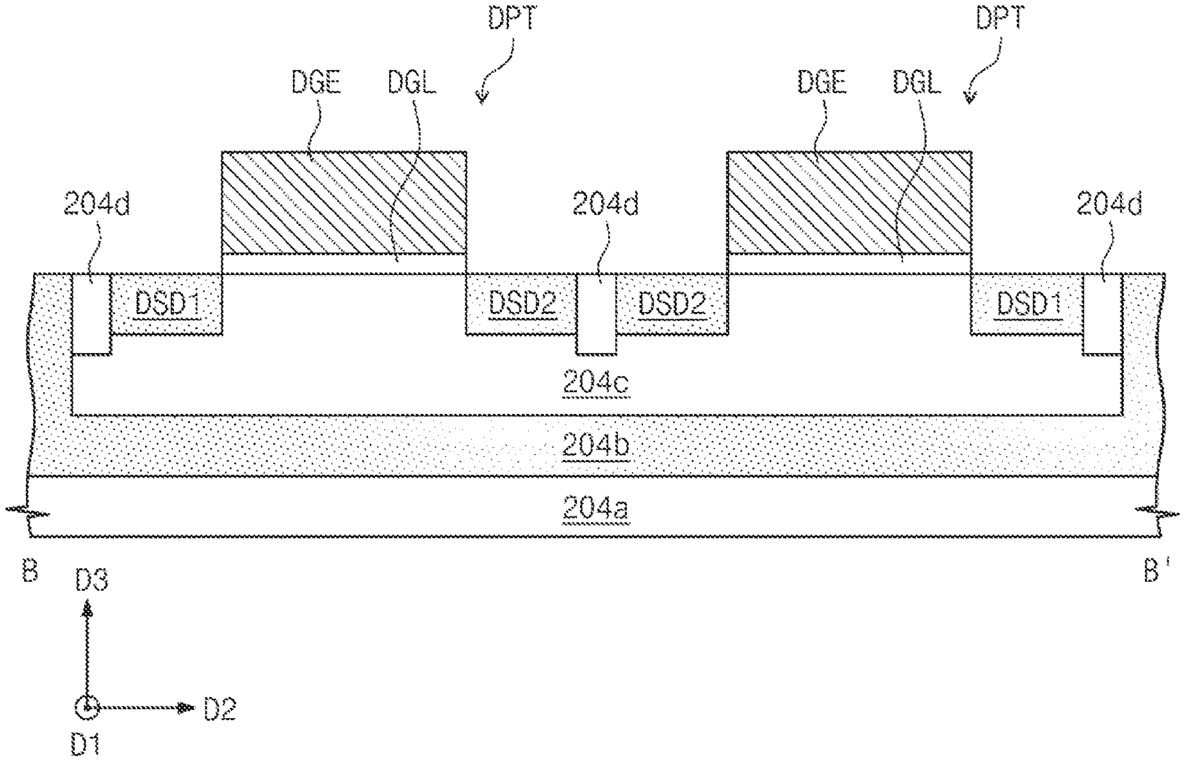
FIG. 6D is a cross-sectional view of a second peripheral circuit region according to some example embodiments.

FIG. 2A is a conceptual diagram of a semiconductor memory device according to some example embodiments. FIG. 2B is a diagram of the memory cell region and the peripheral circuit region from FIG. 2A separately. FIG. 3 is a plan view of the memory cell region according to example embodiments. FIG. 4 is a diagram of the connection region included in one block. FIG. 5 is a plan view of the peripheral circuit region according to example embodiments. FIGS. 6A and 6B are diagrams that show the second peripheral circuit region included in one block. FIG. 6C is a cross-sectional view taken along line A-A' of FIG. 6B. FIG. 6D is a cross-sectional view taken along line B-B' of FIG. 6B. For brevity of explanation, contents that are substantially the same as those described with reference to FIGS. 1A to 1D may not be described.

Referring to FIGS. 2A, 2B, 3, and 5, the semiconductor memory device 10 may include a memory cell region 100 and a peripheral circuit region 200. In example embodiments, the memory cell region 100 and the peripheral circuit region 200 may have the form of a plate parallel to a plane extending along the first direction D1 and the second direction D2. The memory cell region 100 may be on the peripheral circuit region 200 along the third direction D3.

The memory cell region 100 may include a plurality of memory blocks arranged along the second direction D2. The memory cell region 100 may include a cell array region 101 and a connection region 102. The cell array region 101 and the connection region 102 may be arranged along the first direction D1. For example, as shown, a pair of connection regions 102 may be spaced apart from each other along the first direction D1 with the cell array region 101 interposed between them. In another example, one connection region 102 may be disposed between a pair of cell array regions 101 that are spaced apart along the first direction D1, or a plurality of connection regions 102 may be alternately arranged with a plurality of cell array regions 101. The arrangement of the connection region 102 and the cell array region 101 is not limited.

The cell array region 101 may include a plurality of cell strings extending along the third direction D3. The plurality of cell strings may be substantially the same as the cell strings STR11~STR8*z* described in reference to FIGS. 1A to 1D. Each of the plurality of cell strings may include a string selection transistor, a plurality of memory cells, and a ground selection transistor. The plurality of memory cells may be controlled by a plurality of stacked gate electrodes along the third direction D3. The plurality of gate electrodes may be electrically connected to a plurality of word lines.

The plurality of word lines may extend along the first direction D1. The ends of the plurality of word lines may be positioned in the connection region 102. The ends of the plurality of word lines may have a stair-step configuration, arranged along the first direction D1 within the connection region 102. An end segment of the word line, which protrudes along the first direction D1 from a word line forming an immediately adjacent step, may be referred to as a pad. The stair-step structure formed by the plurality of word lines may become closer to the peripheral circuit region 200 or may move away from the peripheral circuit region 200 as it extends along the first direction D1. Exemplary configurations of the stair-step structure may be discussed later.

As shown in FIG. 4, the connection region 102 within one memory block may include a plurality of pad regions PR arranged along the first direction D1. In a view along the third direction D3, at least one pad may be disposed in each of the plurality of pad regions PR. For example, the width, hereinafter referred to as the first width W1, of a pad region PR along the first direction D1 may be substantially the same as the width of a pad along the first direction D1. In some examples, at least some of the plurality of first widths W1 in the plurality of pad regions PR may be the same. In some examples, at least some of the plurality of first widths W1 in the plurality of pad regions PR may be different from each other. In a view along the third direction D3, the plurality of pads within one pad region PR may be arranged along the second direction D2. The number of pads located in one pad region PR may be determined as needed.

The plurality of pad regions PR may be categorized into a plurality of pad groups PG. Each of the plurality of pad groups PG may include pad regions PR that are sequentially arranged along the first direction D1. Contact plugs, which are electrically connected to the pads, may be disposed in the plurality of sequentially arranged pad regions PR. For example, the number of contact plugs may be equal to the number of pads. The plurality of contact plugs may be positioned along both the first D1 and second D2 directions and overlap with the pads along the third direction D3. In some examples, at least some of the contact plugs located in each pad group PG may be arranged at substantially uniform intervals along the first direction D1. In some examples, at least some of the contact plugs located in each pad group PG may be arranged at different intervals along the first direction D1. In one example embodiment, adjacent pad groups PG may be spaced apart from each other along the first direction D1. For example, a region in which pads are not disposed may be provided between immediately adjacent pad groups PG, depending on the processing or design requirements. In another example embodiment, immediately adjacent pad groups PG may be in contact along the first direction D1.

To position pad regions PR, a length along the first direction D1, hereafter referred to as the first length L1, may be needed. The first length L1 may be the sum of the distance between a pair of pad regions PR disposed at both ends along the first direction D1 and the sum of the first widths W1 of that pair of pad regions PR. For illustration, six pad groups PG are shown. The six pad groups PG arranged in the first direction D1 may be referred as the first, second, third, fourth, fifth, and sixth pad groups PG. Although each of the six pad groups PG is illustrated as including four pad regions PR along the first direction D1, this is an example. In other examples, a pad group PG may include fewer or more pad regions PR.

The peripheral circuit region 200 may include a first peripheral circuit region 201 and a second peripheral circuit region 202. The first peripheral circuit region 201 may overlap with the cell array region 101 along the third direction D3. The first peripheral circuit region 201 may include circuits for controlling various operations of the semiconductor memory device 10. In one block, the second peripheral circuit region 202 may overlap with the connection region 102 along the third direction D3.

Referring to FIGS. 6A and 6B, the second peripheral circuit region 202 may include main regions MR and dummy regions DR. In each main region MR, at least one main pass transistor MPT may be located. A plurality of main pass transistors MPT in one main region MR may be arranged along the second direction D2. Although it is shown that two main pass transistors MPT are arranged along the second direction D2 in each main region MR, this is illustrative. In other examples, one or more than three main pass transistors MPT may be positioned in the main region MR. The width of the main region MR, hereafter referred to as the second width W2, may be substantially equal to the pitch of the main pass transistors MPT. In one example, at least some of the second widths W2 of the plurality of main regions MR may be equal to each other. In another example, at least some of the second widths W2 of the plurality of main regions MR may differ from each other. In a view along the third direction D3, the central axis of a main region MR extending along the second direction D2 may overlap with the central axis extending along the second direction D2 of the main pass transistor MPT placed within that main region MR. Main pass transistors MPT may be configured to transmit pass voltage to the plurality of word lines. For example, each of the main pass transistors MPT may be electrically connected to pads. The main pass transistors MPT may have a first polarity. For example, the main pass transistors MPT may be N-channel metal-oxide semiconductor (NMOS) transistors formed on a p-type active pattern.

As shown in FIG. 6C, the main pass transistor MPT may include a first source/drain region SD1, a second source/drain region SD2, a gate electrode GE, and a gate insulating layer GL. A device isolation pattern 204*d* may be provided around the main pass transistors MPT. The device isolation pattern 204*d* may be configured to electrically isolate the main pass transistors MPT from each other, or to block unintended electrical connections between the main pass transistor MPT and other elements. The main pass transistor MPT and the device isolation pattern 204*d* may be formed on a well region 204*c*.

The well region 204*c* may have a first conductivity type. For example, the first conductivity type may be p-type. For example, the well region 204*c* may be a silicon Si region including Group 3 elements e.g., boron B, aluminum Al, gallium Ga, indium In or Group 2 elements as first impurities. The p-type activation pattern may correspond to the well region 204*c*. The first and second source/drain regions SD1 and SD2 may have a second conductivity type. For example, the second conductivity type may be n-type. The plurality of regions may be formed in the well region 204*c* by injecting Group 5 elements e.g., phosphorus P, arsenic As, antimony Sb, Group 6, or Group 7 elements as second impurities. The well region 204*c* may be formed on top of a deep well region 204*b*.

The deep well region 204*b* may also have the second conductivity type. For example, the conductivity type of the deep well region 204*b* may be n-type. In one example, the deep well region 204*b* may be a silicon Si region including the second impurities. The deep well region 204*b* may be provided above the substrate region 204*a*.

The substrate region 204*a* may have the first conductivity type. For example, the conductivity type of the substrate region 204*a* may be p-type. In one example, the substrate region 204*a* may be a region of the remaining silicon substrate after forming both the deep well 204*b* and well regions 204*c*.

The first source/drain region SD1 and the second source/drain region SD2 may be connected to the first contact CT1 for applying a drain signal and the second contact CT2 for applying a pass voltage to the corresponding word line, respectively.

The number of main regions MR may be determined so that the number of pads and the number of main pass transistors MPT are the same. To dispose the plurality of main pass transistors MPT, a total length referred to as the second length L2 equal to the sum of the second widths W2 of the main regions MR may be required. The second length L2 may be shorter than the first length L1. Therefore, the length required to dispose the pads along the first direction D1 (that is, the first length L1), may be greater than the length needed to dispose the main pass transistors MPT along the same first direction D1 (that is, the second length L2). When the main pass transistors MPT are arranged continuously in the first direction D1, the main pass transistors MPT may be spaced apart from corresponding pads in a first direction D1. The separation distance along the first direction D1 between the main pass transistors MPT and corresponding pads may increase as the number of pads and main pass transistors MPT increases. The distance along the first direction D1 between some pads and some main pass transistors MPT may be long. In a view along the third direction D3, as the separation distance between corresponding pads and the main pass transistor MPT increases along the first direction D1, the amount of electrically conductive lines e.g., metal lines for electrical connections may increase. For example, the required electrically conductive line may extend along the first direction D1 between corresponding pads and the main pass transistor MPT. As the number of required electrical conductive lines increases, both the process complexity and the time required for the process may also increase.

The main regions MR may be categorized into main groups MG. Each of the plurality of main groups MG may include main regions MR that are sequentially arranged in the first direction D1. In one example embodiment, immediately adjacent main groups MG may be spaced apart from each other along the first direction D1. The spacing apart of immediately adjacent main groups MG may refer to a situation where the distance, along the first direction D1, between the closest pair of main pass transistors MPT belonging to each of the adjacent main groups MG is greater than the distances between main pass transistors MPT within each main group MG.

In one example embodiment, immediately adjacent main groups MG may contact along the first direction D1. Contacting between immediately adjacent main groups MG may refer to a situation where the distance along the first direction D1 between a pair of main pass transistors MPT that are closest to each other and each belong to immediately adjacent main groups is substantially the same as the distance between the main pass transistors MPT belonging to each of those immediately adjacent main groups MG.

The main groups MG may correspond to pad groups PG, respectively. For illustrative purposes, six main groups MG are shown. The six main groups MG, arranged along the first direction D1, may be referred to as the 1st, 2nd, 3rd, 4th, 5th, and 6th main groups, respectively. While it is shown that each of the plurality of six main groups MG includes four main regions MR sequentially arranged along the first direction D1, this is provided as an example. In other examples, the main group MG may include more or fewer than four main regions MR.

The dummy regions DR may be provided between immediately adjacent main groups MG that are spaced apart along the first direction D1. The number of dummy regions DR between such adjacent main groups MG may be determined as needed. For example, one dummy region DR may be provided, or a plurality of dummy regions DR may be sequentially arranged along the first direction D1. In each of the dummy regions DR, at least one dummy pass transistor DPT may be provided. A plurality of dummy pass transistors DPT disposed in one dummy region DR may be arranged along the second direction D2. While it is shown that each dummy region DR includes two dummy pass transistors DPT arranged along the second direction D2, this is provided as an example. In other examples, the dummy region DR may include one or more than three dummy pass transistors DPT. The width of the dummy region DR, referred to as the third width W3, may be substantially the same as the pitch of the dummy pass transistor DPT. In one example, at least some of the third widths W3 among a plurality of dummy regions DR may be equal from each other. In one example, at least some of the third widths W3 of the plurality of dummy regions DR may be different from each other. The third width W3 of the dummy region DR may also be substantially the same as the second width W2 of the main region MR. In a view along the third direction D3, the central axis of the dummy region DR extending along the second direction D2 may overlap with the central axis of the dummy pass transistor DPT that extends along the second direction D2. The dummy pass transistors DPT may have the first polarity. For example, the dummy pass transistors DPT may be NMOS transistors formed on a p-type active pattern. The plurality of dummy pass transistors DPT may be configured so as not to transmit voltage to the word line. For example, the dummy pass transistors DPT may not be electrically connected to (i.e., may be electrically isolated from) the pad.

As illustrated in FIG. 6D, the dummy pass transistor DPT may include a first and second dummy source/drain region DSD1, DSD2, a dummy gate electrode DGE, and a dummy gate insulating layer DGL provided on a substrate region 204*a*, a deep well region 204*b*, and a well region 204*c*. The substrate region 204*a*, the deep well region 204*b*, the well region 204*c*, the first dummy source/drain region DSD1, the second dummy source/drain region DSD2, the dummy gate electrode DGE, and the dummy gate insulating layer DGL may be substantially the same as the substrate region 204*a*, the deep well region 204*b*, the well region 204*c*, the first source/drain region SD1, the second source/drain region SD2, the gate electrode GE, and the gate insulating layer GL described with reference to FIG. 6C, respectively. In one example, the dummy pass transistor DPT may be formed in the same process as the main pass transistor MPT.

In contrast to the main pass transistor MPT, contacts may not be provided on the first and second dummy source/drain regions DSD1, DSD2. Therefore, the first and second dummy source/drain regions DSD1, DSD2 may not be electrically connected to the pad and may be configured not to transmit voltage to the word line.

Figure 7:
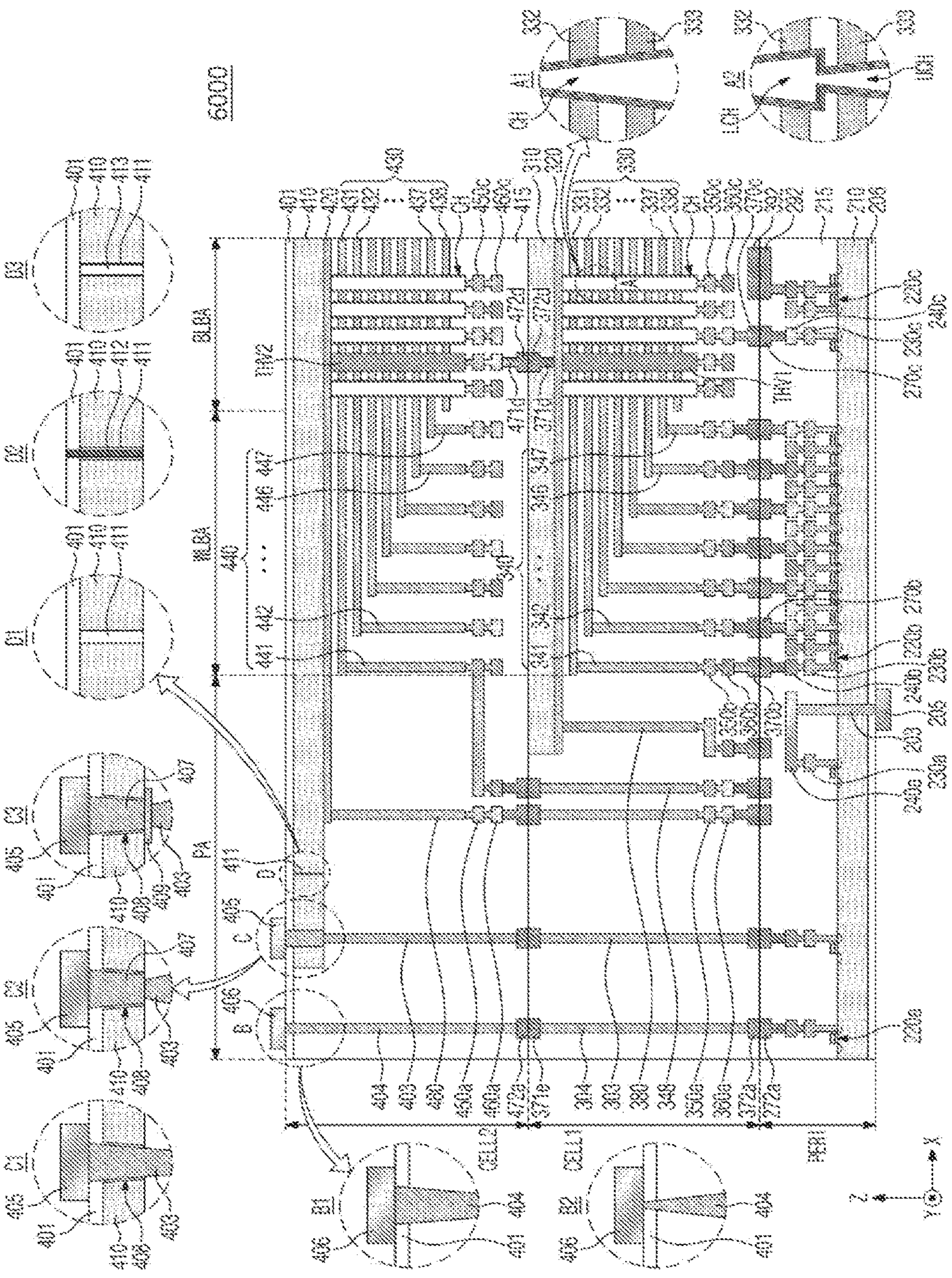
FIG. 7 is a diagram of a semiconductor memory device according to some example embodiments.

FIG. 7 is a diagram illustrating a semiconductor memory device according to some example embodiments.

Referring to FIG. 7, the semiconductor memory device 6000 may be provided. The semiconductor memory device 6000 may be the semiconductor memory device 10 shown in FIGS. 2A and 2B. The memory device 6000 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may indicate a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) and/or tungsten (W).

The memory device 6000 may include the at least one upper chip including the cell region. For example, the memory device 6000 may include two upper chips. However, the number of the upper chips is not limited thereto. In the case in which the memory device 6000 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 6000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In this regard, an upper portion of the lower chip may indicate an upper portion defined based on a +Z-axis direction, and the upper portion of each of the first and second upper chips may indicate an upper portion defined based on a −Z-axis direction. However, example embodiments are not limited thereto. In some example embodiments, one of the first upper chip and the second upper chip may be turned over and then may be connected to a corresponding chip by the bonding method.

Each of the peripheral circuit region PERI and the first and second cell regions CELL1 and CELL2 of the memory device 6000 may include an external pad bonding region PA, a word line bonding region WLBA, and a bit line bonding region BLBA.

The peripheral circuit region PERI may include a first substrate 210 and a plurality of circuit elements 220*a*, 220*b* and 220*c* formed on the first substrate 210. An interlayer insulating layer 215 including one or more insulating layers may be provided on the plurality of circuit elements 220*a*, 220*b* and 220*c*, and a plurality of metal lines electrically connected to the plurality of circuit elements 220*a*, 220*b* and 220*c* may be provided in the interlayer insulating layer 215. For example, the plurality of metal lines may include first metal lines 230*a*, 230*b* and 230*c* connected to the plurality of circuit elements 220*a*, 220*b* and 220*c*, and second metal lines 240*a*, 240*b* and 240*c* formed on the first metal lines 230*a*, 230*b* and 230*c*. The plurality of metal lines may be formed of at least one of various conductive materials. For example, the first metal lines 230*a*, 230*b* and 230*c* may be formed of tungsten having a relatively high electrical resistivity, and the second metal lines 240*a*, 240*b* and 240*c* may be formed of copper having a relatively low electrical resistivity.

The first metal lines 230*a*, 230*b* and 230*c* and the second metal lines 240*a*, 240*b* and 240*c* are illustrated and described in the some example embodiments. However, example embodiments are not limited thereto. In some example embodiments, at least one or more additional metal lines may further be formed on the second metal lines 240*a*, 240*b* and 240*c*. In this case, the second metal lines 240*a*, 240*b* and 240*c* may be formed of aluminum, and at least some of the additional metal lines formed on the second metal lines 240*a*, 240*b* and 240*c* may be formed of copper having an electrical resistivity lower than that of aluminum of the second metal lines 240*a*, 240*b* and 240*c*.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (for example, including word lines 331 to 338) may be stacked on the second substrate 310 in a direction (e.g., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (for example, including word lines 431 to 438) may be stacked on the third substrate 410 in a direction (e.g., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some example embodiments, as illustrated in a region ‘A1’, the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (e.g., a Y-axis direction) parallel to the top surface of the second substrate 310.

In some example embodiments, as illustrated in a region ‘A2’, the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform width. The memory device 6000 according to the some example embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

The number of the lower word lines 331 and 332 penetrated by the lower channel LCH is less than the number of the upper word lines 333 to 338 penetrated by the upper channel UCH in the region 'A2'. However, example embodiments are not limited thereto. In some example embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. The first through-electrode THV1 may penetrate the common source line 320 and the plurality of word lines 330. In some example embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some example embodiments, the first through-electrode THV1 and the second through-electrode THV2 may be electrically connected to each other through a first through-metal pattern 372*d* and a second through-metal pattern 472*d*. The first through-metal pattern 372*d* may be formed at a bottom end of the first upper chip including the first cell region CELL1, and the second through-metal pattern 472*d* may be formed at a top end of the second upper chip including the second cell region CELL2. The first through-electrode THV1 may be electrically connected to the first metal line 350*c* and the second metal line 360*c*. A lower via 371*d* may be formed between the first through-electrode THV1 and the first through-metal pattern 372*d*, and an upper via 471*d* may be formed between the second through-electrode THV2 and the second through-metal pattern 472*d*. The first through-metal pattern 372*d* and the second through-metal pattern 472*d* may be connected to each other by the bonding method.

In addition, in the bit line bonding region BLBA, an upper metal pattern 292 may be formed in an uppermost metal layer of the peripheral circuit region PERI, and an upper metal pattern 392 having the same shape as the upper metal pattern 292 may be formed in an uppermost metal layer of the first cell region CELL1. The upper metal pattern 392 of the first cell region CELL1 and the upper metal pattern 292 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

In the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). The region where the cell contact plugs 340 (341-347) are connected may be referred to as a pad. First metal lines 350*b* and second metal lines 360*b* may be sequentially connected onto the cell contact plugs 340 connected to the word lines 330. In the word line bonding region WLBA, the cell contact plugs 340 may be connected to the peripheral circuit region PERI through upper bonding metal patterns 370*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 370*b* of the first cell region CELL1 and the upper bonding metal patterns 270*b* of the peripheral circuit region PERI. In some example embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (for example, including contact plugs 441 to 447). The region where the cell contact plugs 340 (341-347) are connected may be referred to as a pad. The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other by the bonding method. The upper bonding metal patterns 370*b* and the upper bonding metal patterns 270*b* may be formed of aluminum, copper, and/or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be disposed in the external pad bonding region PA. A lower insulating layer 206 may cover a bottom surface of the first substrate 210, and a first input/output pad 205 may be formed on the lower insulating layer 206. The first input/output pad 205 may be connected to at least one of a plurality of the circuit elements 220*a* disposed in the peripheral circuit region PERI through a first input/output contact plug 203 and may be separated from the first substrate 210 by the lower insulating layer 206. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220*a* disposed in the peripheral circuit region PERI through second input/output contact plugs 403 and 303, and the third input/output pad 406 may be connected to at least one of the plurality of circuit elements 220*a* disposed in the peripheral circuit region PERI through third input/output contact plugs 404 and 304.

In some example embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some example embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In this regard, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In some example embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In this regard, like the channel structure CH in the region 'A1,' the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In some example embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some example embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, example embodiments are not limited thereto, and in some example embodiments, the diameter of the second input/output contact plug 403 may become progressively less toward the second input/output pad 405.

In some example embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In some example embodiments illustrated in a region 'C3', a stopper 409 may further be formed on a bottom end of the opening 408 of the third substrate 410, as compared with the region 'C2', discussed above. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371*e* or may become progressively greater toward the lower metal pattern 371*e*.

In some example embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some example embodiments, as illustrated in a region 'D1', the slit 411 may be formed to penetrate the third substrate 410. For example, the slit 411 may be used to prevent, or reduce the occurrence of, the third substrate 410 from being finely cracked when the opening 408 is formed. However, example embodiments are not limited thereto, and in some example embodiments, the slit 411 may be formed to have a depth ranging from about or exactly 60% to about or exactly 70% of a thickness of the third substrate 410.

In some example embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In some example embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Because the insulating material 413 is formed in the slit 411, it is possible to prevent or reduce a voltage provided through the second input/output pad 405 from affecting a metal layer disposed on the third substrate 410 in the word line bonding region WLBA.

In some example embodiments, the first to third input/output pads 205, 405 and 406 may be selectively formed. For example, the memory device 6000 may be realized to include only the first input/output pad 205 disposed on the first substrate 210, to include only the second input/output pad 405 disposed on the third substrate 410, to include only the third input/output pad 406 disposed on the upper insulating layer 401, or some other combination.

In some example embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The storage device 1000 (or other circuitry, for example, flash memory 1100, memory controller 1200, memory cell array 1110, peripheral circuit 1115, ADDR decoder 1120, page buffer circuit 1130, data input/output circuit 1140, word line voltage generator 1150, control logic 1160, or other subcomponents) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Figure 8:
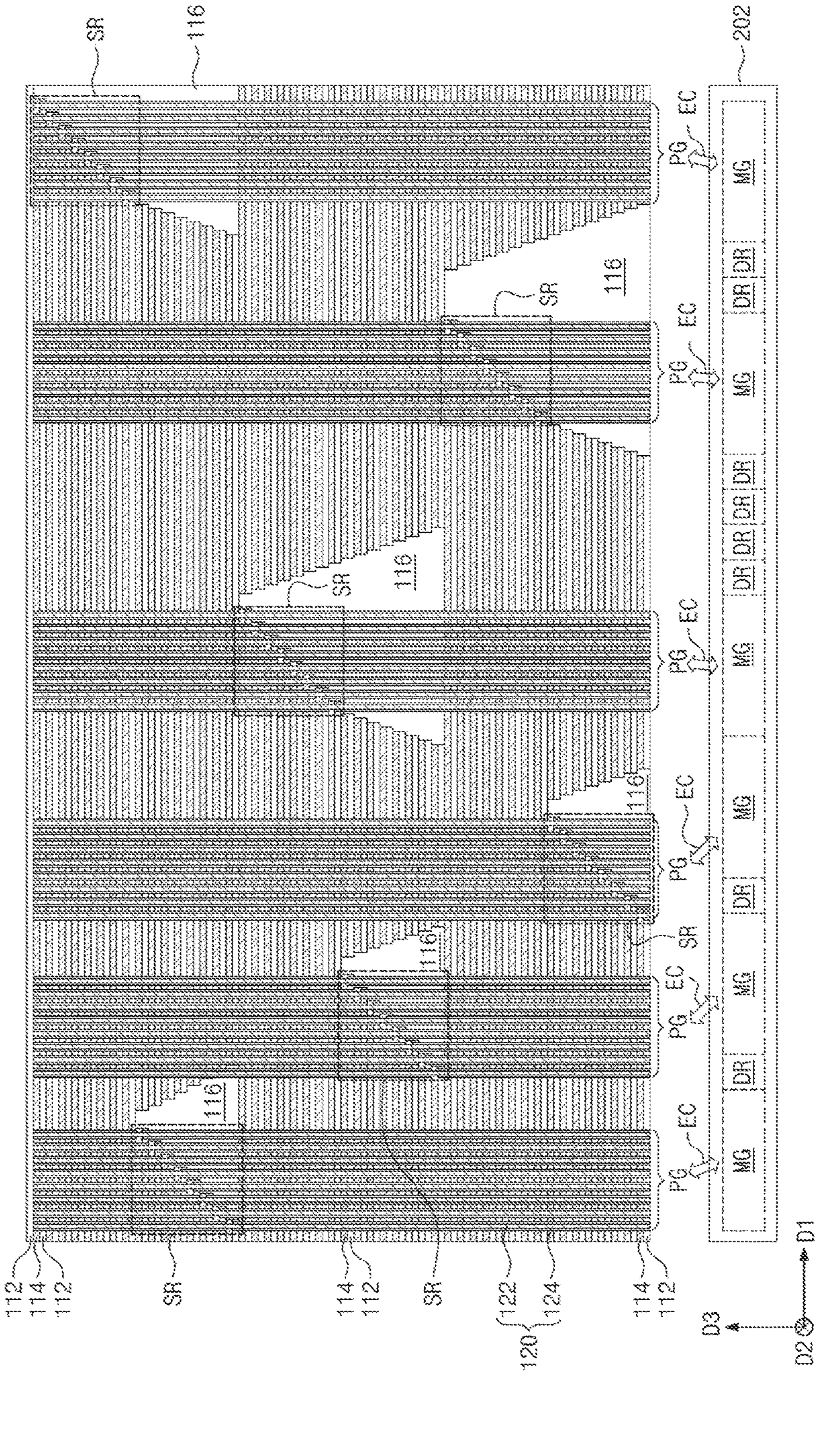
FIG. 8 is a cross-sectional view of a second peripheral circuit region according to some example embodiments.

FIG. 8 is a cross-sectional view that describes the step-like structure of word lines and a second peripheral circuit region according to example embodiments.

Referring to FIG. 8, a stacked structure may be provided. The stacked structure may include word lines 114, stacked insulating layers 112, insulating patterns 116, and contact structures 120. The word lines 114 may be substantially the same as the word lines 330 as described in reference to FIG. 7. The stacked insulating layers 112 may be provided between word lines 114, respectively. The insulating layers 112 and the word lines 114 may be alternately stacked in a third direction D3 to form a stacked structure.

The insulating patterns 116 may be inserted in the stacked structure. For example, the insulating patterns 116 may be formed by alternately layering insulating layers 112 and word lines 114 on top of a substrate, etching portions of the layered structure to form pads, and filling the regions where the layered structure be removed with an insulating material. The process may be repeated a plurality of times. After a primary stacked structure is formed with inserted insulating patterns 116, a secondary stacked structure with insulating patterns 116 may be created by performing the same process on top of the primary structure. The stacked structure shown in FIG. 8 may be formed by repeating the process three times. In one example, adjacent insulating patterns 116 along the third direction D3 may be connected.

The process of etching the stacked structure may form step regions SR. The step regions SR may include ends of the word lines 114 that have a step-like structure. The protruding ends from one word line 114 may be referred to as pads. The pads in one step region SR are shown to move away from the second peripheral circuit region 202 along the first direction D1, but this is provided as an example. In another example, the pads may be formed to get closer to the second peripheral circuit region 202 along the first direction D1. The step regions SR may correspond to the pad groups PG, respectively. For example, in a view along the third direction D3, the step region SR may be disposed within the corresponding pad group PG.

Each of the pad groups PG may include the previously described pad regions. The pad regions may be arranged in a first direction D1. In a view along a third direction D3, pads arranged in a second direction D2 may be disposed within each of the pad regions. Although FIG. 8 illustrates eight pads arranged in the first direction D1 within each pad group PG, this is provided as an example. In another example, fewer than 8 or more than 8 pads arranged along the first direction D1 may be disposed in each of the pad groups PG. The interval between the pad groups PG may be determined as needed.

The contact structures 120 may be inserted into the stacked structure. The contact structures 120 may extend along the third direction D3. Each of the contact structures 120 may include a contact plug 122 positioned inside the contact structure when viewed along the third direction D3, and an insulating sidewall 124 that surrounds the contact plug 122. Both the contact plug 122 and the insulating sidewall 124 may extend along the third direction D3. The contact plug 122 may be electrically connected to any one of the pads. The insulating sidewall 124 may not be provided between pads and the contact plug 122 that are electrically connected. For example, a pad may be extended laterally to the side of corresponding contact plug 122 to contact with the contact plug 122, directly. The contact plug 122 may be electrically connected to any one of the word lines 114. In a view along the third direction D3, the contact plugs 122 may be disposed in the pad groups PG corresponding to the step regions SR that include pads electrically connected to the contact plugs 122.

The second peripheral circuit region 202 may include main groups MG. Each of the main groups MG may include the previously described main regions. The main regions may be arranged along the first direction D1. In a view along the third direction D3, main pass transistors may be arranged along the second direction D2 within each of the main regions. The main pass transistors within the main group MG may be electrically connected to the contact plugs 122 disposed in the corresponding pad group PG, respectively. The main groups MG may be arranged adjacent to the corresponding pad groups PG. The length of the conductive line for electrical connection between the main pass transistors and pads in the corresponding main group MG and pad group PG may be reduced. Accordingly, the manufacturing complexity and manufacturing time of the semiconductor memory device 10 may be reduced. A dummy region DR may be provided between the main groups MG. The dummy region DR may be substantially the same as the dummy region DR described with reference to FIGS. 2A to 6D.

Figure 9:
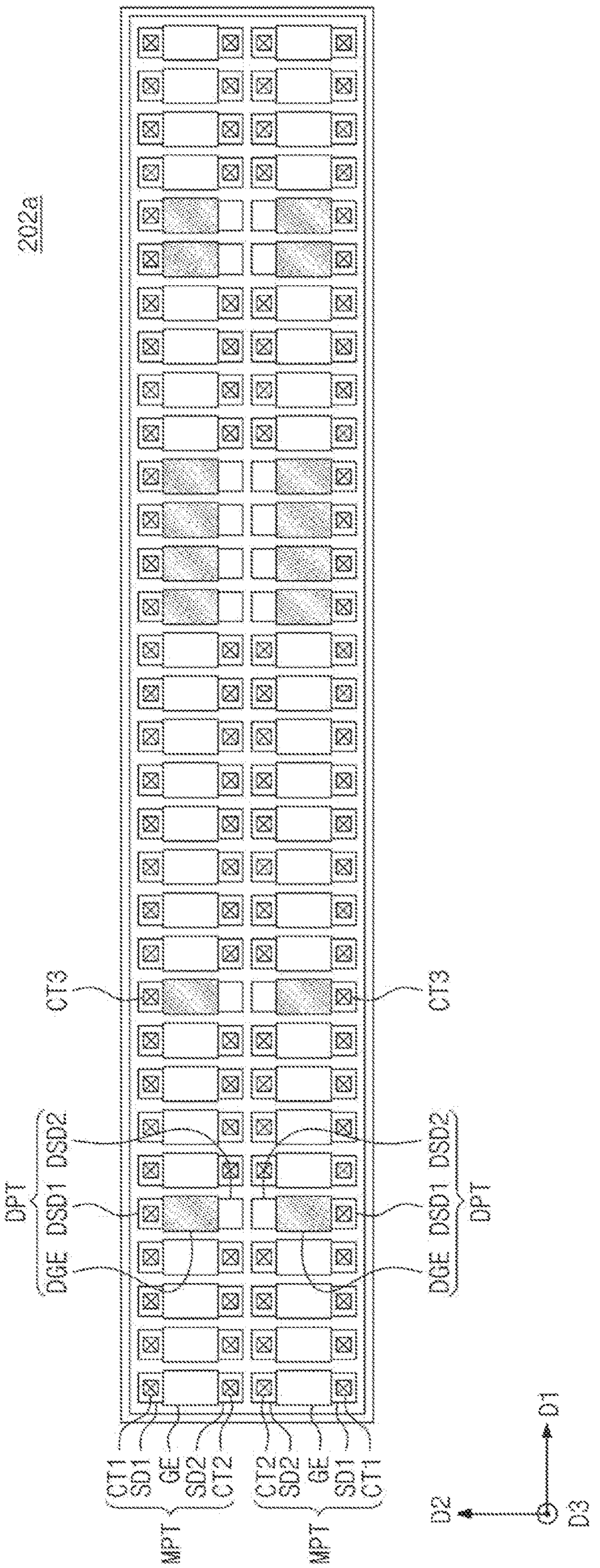
FIG. 9 is a diagram of a second peripheral circuit region corresponding to one block according to some example embodiments.

FIG. 9 is a diagram illustrating a second peripheral circuit region corresponding to one block according to example embodiments. For brevity of explanation, contents substantially the same as that described with reference to FIGS. 2A to 6D may not be described.

Referring to FIGS. 6A and 9, a second peripheral circuit region 202*a* corresponding to one block may be provided. The second peripheral circuit region 202*a* may include main regions MR in which main pass transistors MPT are disposed and dummy regions DR in which dummy pass transistors DPT are disposed. In contrast to the above description with reference to FIGS. 2A to 6D, the third contacts CT3 may be respectively connected to the first dummy source/drain regions DSD1 of the dummy pass transistors DPT. In one example, a source/drain signal may be applied to the first source/drain regions DSD1 of the dummy pass transistors DPT through the third contacts CT3. Accordingly, one or more example embodiments provide a semiconductor memory device with improved reliability.

Figure 10:
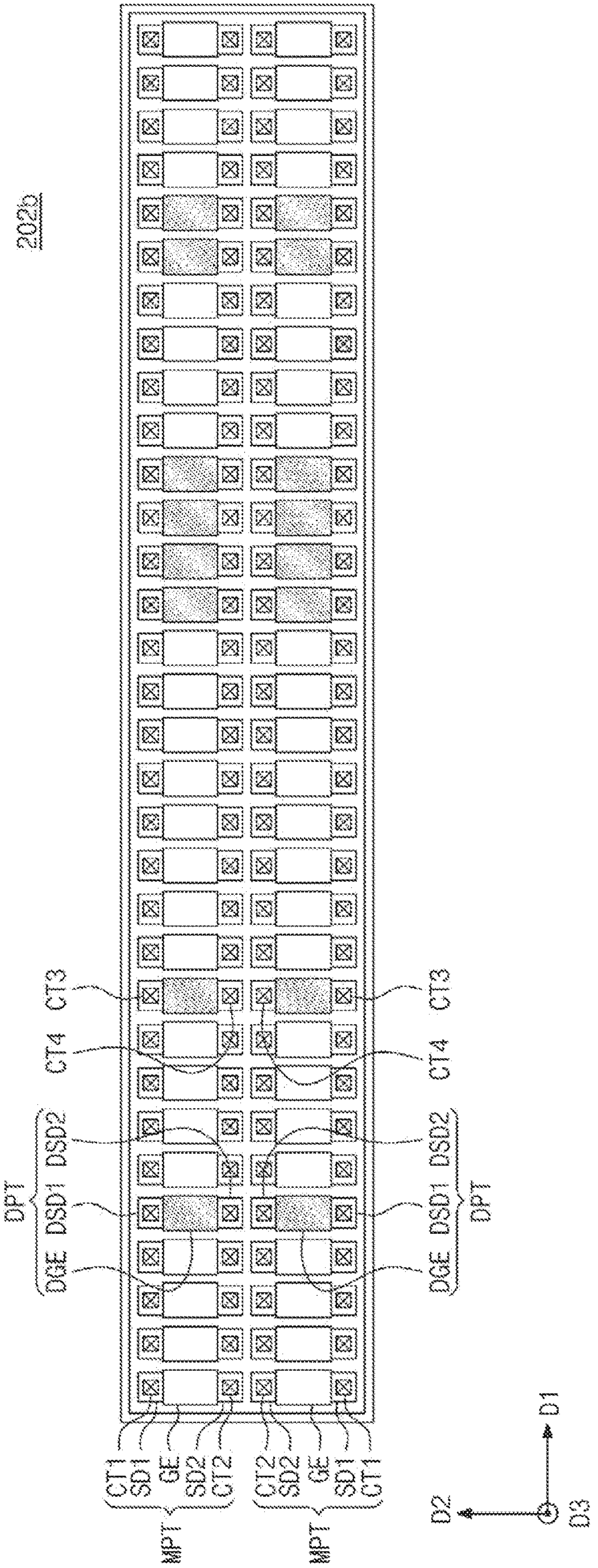
FIG. 10 is a diagram of a second peripheral circuit region corresponding to one block according to some example embodiments.

FIG. 10 is a diagram illustrating a second peripheral circuit region corresponding to one block according to example embodiments. For brevity of explanation, contents substantially the same as that described with reference to FIGS. 2A to 6D may not be described.

Referring to FIGS. 6A and 10, a second peripheral circuit region 202*b* corresponding to one block may be provided. The second peripheral circuit region 202*b* may include main regions MR in which main pass transistors MPT are disposed and dummy regions DR in which dummy pass transistors DPT are disposed. In contrast to the above description with reference to FIGS. 2A to 6D, third contacts CT3 and fourth contacts CT4 may be respectively connected to the first dummy source/drain regions DSD1 and the second dummy source/drain regions DSD2 of the dummy pass transistors DPT. The dummy pass transistors DPT may have a second polarity different from that of the main pass transistors MPT. For example, the dummy pass transistors DPT may be P-channel metal-oxide semiconductor transistors formed in a p-type active pattern. For example, the dummy pass transistors DPT may be PMOS transistors formed in the same p-type active pattern as the main pass transistors MPT. In one example, a body bias is applied to the first dummy source/drain regions DSD1 and second dummy source/drain regions DSD2 of the dummy pass transistors DPT through the third contacts CT3 and fourth contacts CT4. In this case, the dummy pass transistors DPT may apply a body bias, and therefore perform the function of a guard ring.

In another example, as described with reference to FIG. 6D, the dummy pass transistors DPT may have the same first polarity as the main pass transistors MPT. For example, the dummy pass transistors DPT and main pass transistors MPT may be NMOS transistors formed in a p-type active pattern.

In one example, the dummy pass transistors DPT may have a different function from the main pass transistor MPT. For example, the dummy pass transistors DPT may be configured to generate a drain signal applied to the main pass transistors MPT e.g., the first source/drain region SD1.

Figure 11:
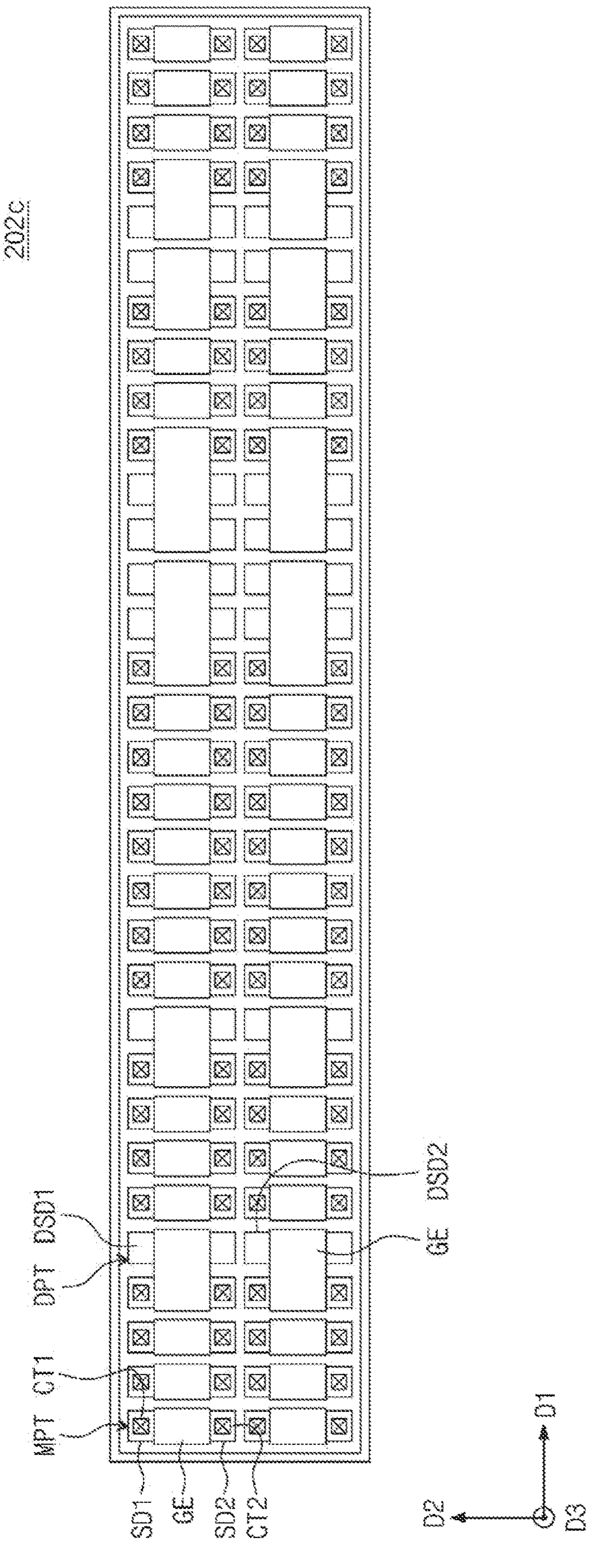
FIG. 11 is a diagram of a second peripheral circuit region corresponding to one block according to some example embodiments.

FIG. 11 is a diagram illustrating a second peripheral circuit region corresponding to one block according to example embodiments. For brevity of explanation, contents substantially the same as that described with reference to FIGS. 2A to 6D may not be described.

Referring to FIGS. 6A and 11, a second peripheral circuit region 202*d* corresponding to one block may be provided. The second peripheral circuit region 202*d* may include main regions MR in which main pass transistors MPT are disposed and dummy regions DR in which dummy pass transistors DPT are disposed. In contrast to the above description with reference to FIGS. 2A to 6D, the dummy pass transistor DPT may share the gate electrode GE with at least one of the main pass transistors MPT immediately adjacent to the dummy pass transistor DPT. For example, the gate electrode GE of the main pass transistor MPT may be configured to extend onto the active pattern of the adjacent dummy pass transistor DPT. When the dummy pass transistors DPT are arranged in series, the plurality of dummy pass transistors DPT and the main pass transistor MPT immediately adjacent thereto may share the gate electrode GE. For example, the gate electrode GE of the main pass transistor MPT may extend onto the plurality of dummy pass transistors DPT.

Figure 12:
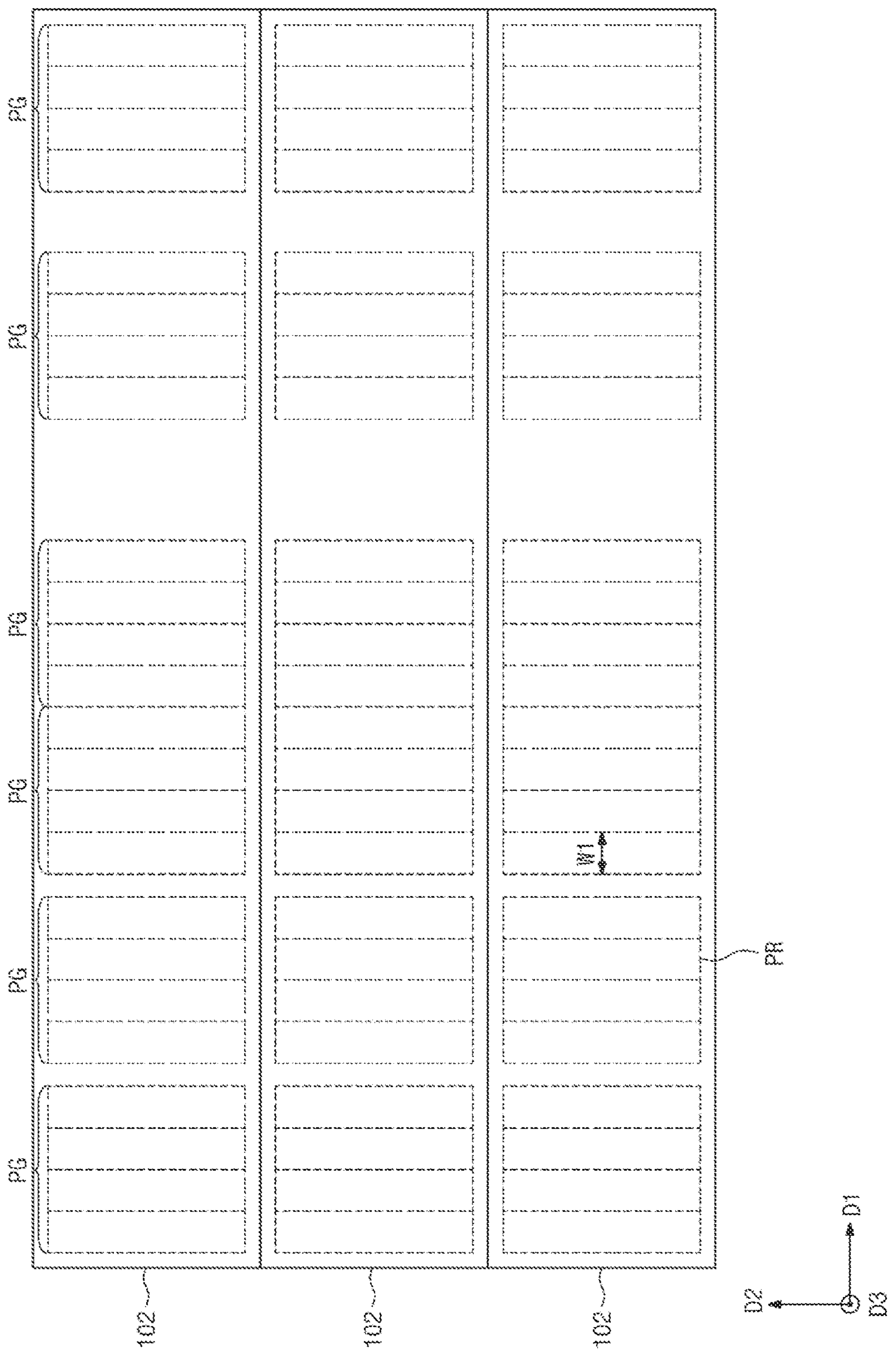
FIG. 12 shows connection regions included in a plurality of blocks according to some example embodiments.
Figure 13A:
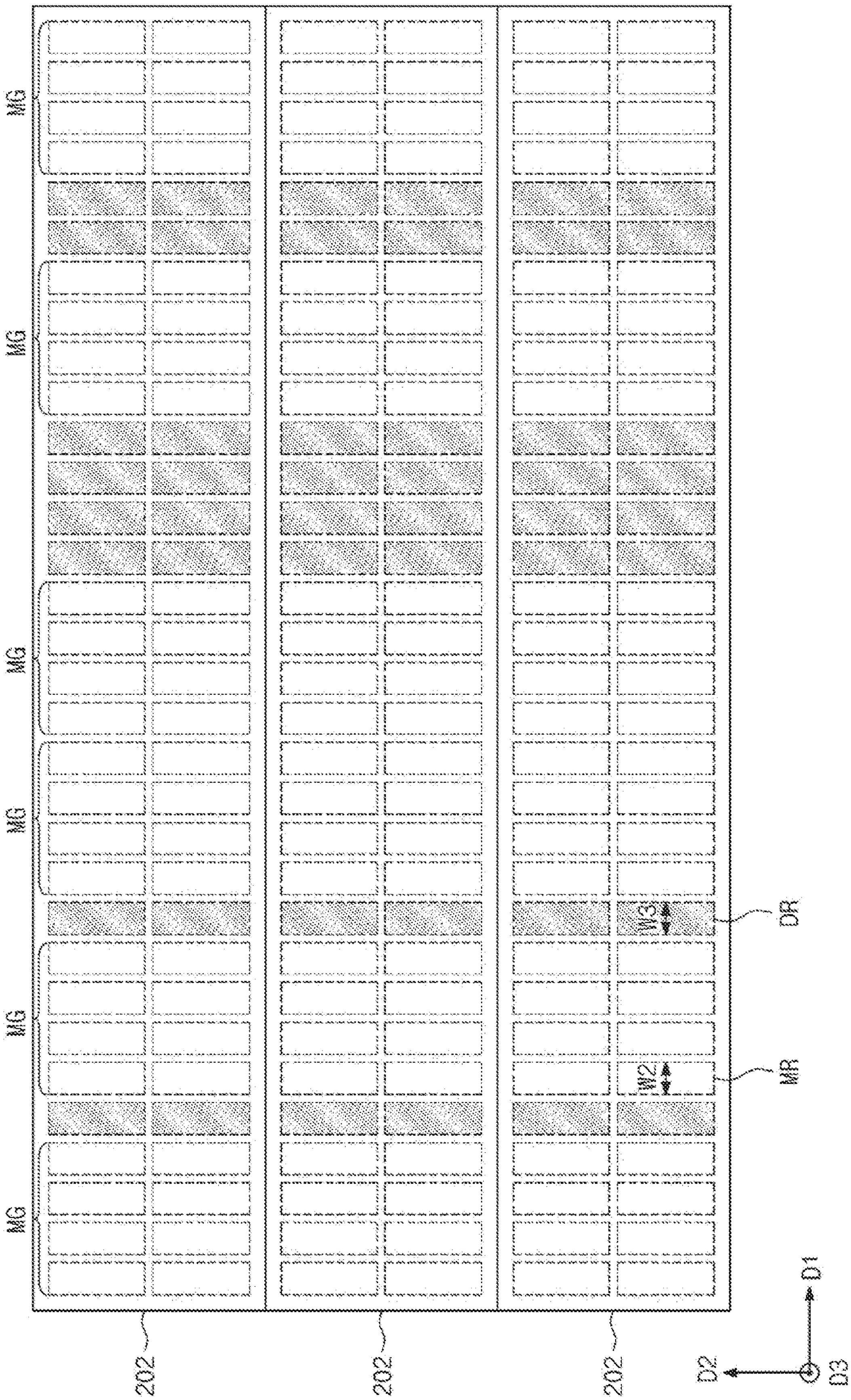
FIGS. 13A and 13B are diagrams showing second peripheral circuit regions corresponding to a plurality of blocks according to some example embodiments.
Figure 13B:
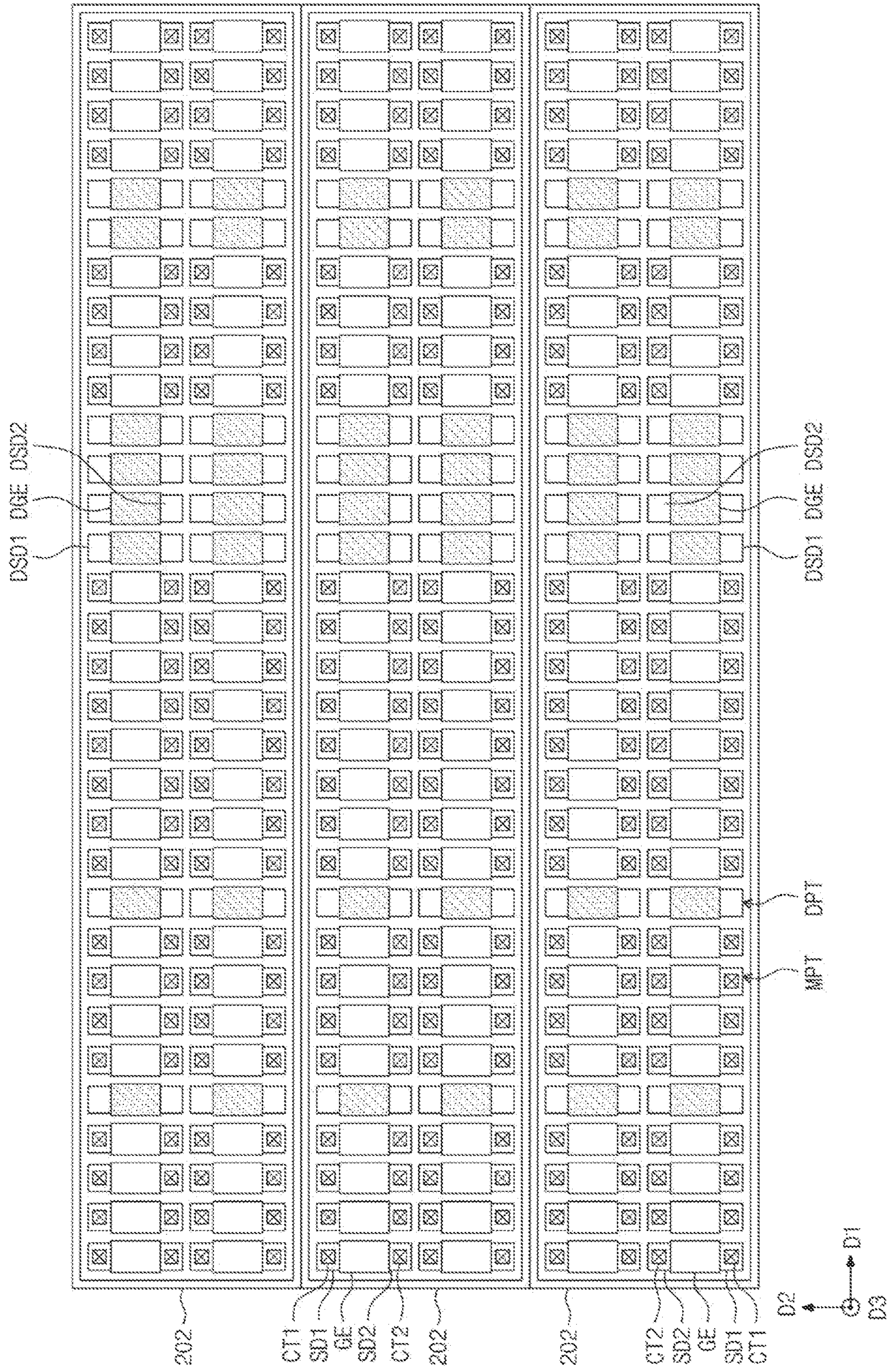

FIG. 12 shows connection regions included in a plurality of blocks according to example embodiments. FIGS. 13A and 13B are diagrams showing second peripheral circuit regions corresponding to a plurality of blocks. For brevity of explanation, contents substantially the same as that described with reference to FIGS. 2A to 6D may not be described.

Referring to FIG. 12, connection regions 102 may be provided. By way of example, three connection regions 102 are shown. The connection regions 102 may each be included in a plurality of blocks. The connection regions 102 may be arranged along the second direction D2. Each of the connection regions 102 includes pad regions PR arranged along the first direction D1, pads disposed in the pad regions PR for example, pad of FIGS. 7 and 8, pad groups PG that classify the pad regions PR, and contact plugs connected to the pads. A description of each of the connection regions 102 is omitted because it is substantially the same as that of the connection region 102 described with reference to FIG. 4. Although the pad regions PR are shown as having the same arrangement structure within the connection regions 102, this is provided as an example. In another example, the pad regions PR may have different arrangement structures within different connection regions 102.

Referring to FIGS. 13A and 13B, second peripheral circuit regions 202 may be provided. By way of example, three second peripheral circuit regions 202 are shown. The second peripheral circuit regions 202 may respectively correspond to a plurality of blocks. The second peripheral circuit regions 202 may overlap the connection regions 102 included in corresponding blocks along the third direction D3. The second peripheral circuit regions 202 may be arranged along the second direction D2. Each of the second peripheral circuit regions 202 includes main regions MR in which main pass transistors MPT are disposed, main groups MG that classify the main regions MR, dummy regions DR where dummy pass transistors DPT is disposed, and contacts CT1 and CT2 connected to the first source/drain regions SD1 and second source/drain regions SD2 of the main pass transistors MPT. Although each of the second peripheral circuit regions 202 shown in FIG. 13B is shown to be the same as the second peripheral circuit region 202*a* in FIG. 6B, this is provided as an example. In another example, each of the second peripheral circuit regions 202 shown in FIG. 13B is the second peripheral circuit region 202*a* of FIG. 9, the second peripheral circuit region 202*b* of FIG. 10, or the second peripheral circuit region 202*c* of FIG. 11. The description of each of the second peripheral circuit regions 202 is omitted because it is substantially the same as that of the second peripheral circuit region 202*a* described with reference to FIGS. 6A and 6D. Although the main regions MR and the dummy regions DR are shown as having the same arrangement structure within the second peripheral circuit regions 202, this is provided as an example. In another example, the main regions MR and the dummy regions DR may have different arrangement structures within different second peripheral circuit regions 202. In one example, the arrangement structure of the main regions MR may be determined according to the arrangement structure of the corresponding pad regions PR, and the dummy regions DR may be disposed between the main groups MG.

Accordingly, a semiconductor memory device with improved reliability may be provided.

In some example embodiments, each of the components represented by a block as illustrated in FIGS. 1A and 1B may be implemented as various numbers of hardware, software and/or firmware structures that execute respective functions described above, according to example embodiments. For example, at least one of these components may include various hardware components including a digital circuit, a programmable or non-programmable logic device or array, an application specific integrated circuit (ASIC), transistors, capacitors, logic gates, or other circuitry using use a direct circuit structure, such as a memory, a processor, a logic circuit, a look-up table, etc., that may execute the respective functions through controls of one or more microprocessors or other control apparatuses. Also, at least one of these components may include a module, a program, or a part of code, which contains one or more executable instructions for performing specified logic functions, and executed by one or more microprocessors or other control apparatuses. Also, at least one of these components may further include or may be implemented by a processor such as a central processing unit (CPU) that performs the respective functions, a microprocessor, or the like. Functional aspects of example embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of example embodiments have been particularly shown and described, it will be understood that various changes in form and details may be made therein without departing from the spirit and scope of the following claims.

What is claimed is:

1. A three-dimensional (3D) semiconductor memory device comprising:

a memory cell region; and a peripheral circuit configured to control the memory cell region, wherein the memory cell region comprises:

a cell array region comprising a plurality of memory cells arranged vertically along a vertical direction; and a connection region comprising ends of a plurality of word lines that are connected to the plurality of memory cells, wherein the ends form a stair-step configuration, wherein the peripheral circuit comprises a peripheral circuit region overlapping the connection region along the vertical direction, wherein the peripheral circuit region comprises a first main pass transistor electrically connected to a first word line of the plurality of word lines, and a first dummy pass transistor electrically separated from the plurality of word lines, and wherein the first main pass transistor and the first dummy pass transistor are arranged along a first direction perpendicular to the vertical direction.

2. The 3D semiconductor memory device of claim 1, wherein the peripheral circuit region further comprises a second main pass transistor electrically connected to a second word line of the plurality of word lines, and wherein the first main pass transistor and the second main pass transistor are spaced apart from each other along the first direction with the first dummy pass transistor interposed therebetween.

3. The 3D semiconductor memory device of claim 2, wherein the first main pass transistor is one of a plurality of first main pass transistors and the second main pass transistor is one of a plurality of second main pass transistors, wherein the plurality of first main pass transistors is sequentially arranged along the first direction, and wherein the plurality of second main pass transistors is sequentially arranged along a second direction that is perpendicular to each of the first direction and the vertical direction.

4. The 3D semiconductor memory device of claim 3, wherein the peripheral circuit region further comprises a second dummy pass transistor that is electrically separated from the plurality of word lines, and wherein the second dummy pass transistor is provided between the plurality of first main pass transistors and the plurality of second main pass transistors.

5. The 3D semiconductor memory device of claim 1, wherein the peripheral circuit region further comprises a second dummy pass transistor that is electrically separated from the plurality of word lines, and wherein the first dummy pass transistor is provided directly adjacent the second dummy pass transistor along the first direction.

6. The 3D semiconductor memory device of claim 1, wherein the first main pass transistor comprises a first source/drain region, a second source/drain region, a gate electrode, and a gate insulating layer, wherein the first dummy pass transistor comprises a first dummy source/drain region, a second dummy source/drain region, a dummy gate electrode, and a dummy gate insulating layer, and wherein the peripheral circuit region comprises a first contact electrically connected to the first source/drain region, and a second contact electrically connected to the second source/drain region.

7. The 3D semiconductor memory device of claim 6, wherein the peripheral circuit region comprises a third contact electrically connected to the first dummy source/drain region and configured to provide a source/drain signal to the first dummy source/drain region.

8. The 3D semiconductor memory device of claim 6, wherein the peripheral circuit region comprises fourth contacts electrically connected to the first dummy source/drain region and the second dummy source/drain region, wherein the fourth contacts are configured to apply a body bias to the first dummy source/drain region and the second dummy source/drain region, and wherein a polarity of the first dummy pass transistor is opposite to a polarity of the first main pass transistor.

9. The 3D semiconductor memory device of claim 1, wherein a width of the first main pass transistor along the first direction is smaller than a protrusion width of an end of a second word line that protrudes along the first direction from an end of an immediately adjacent first word line.

10. The 3D semiconductor memory device of claim 1, wherein the first main pass transistor and the first dummy pass transistor are configured to share a gate electrode.

11. A three-dimensional (3D) semiconductor memory device comprising:

a memory cell region; and a peripheral circuit configured to control the memory cell region, wherein the memory cell region comprises:

a cell array region comprising a plurality of memory cells arranged along a vertical direction; and a connection region comprising ends of a plurality of word lines that are connected to the plurality of memory cells, wherein the peripheral circuit comprises a peripheral circuit region overlapping the connection region along the vertical direction, wherein the peripheral circuit region comprises a plurality of main pass transistors electrically connected to the plurality of word lines, and a plurality of dummy pass transistors electrically separated from the plurality of word lines, and wherein the plurality of main pass transistors is arranged along a first direction perpendicular to the vertical direction.

12. The 3D semiconductor memory device of claim 11, wherein the plurality of main pass transistors is classified into a plurality of main groups, and wherein a first dummy pass transistor of the plurality of dummy pass transistors is provided between a pair of main groups among the plurality of main groups.

13. The 3D semiconductor memory device of claim 12, wherein a second dummy pass transistor and a third dummy pass transistor of the plurality of dummy pass transistors are spaced apart from each other along the first direction with a first main group of the plurality of main groups interposed.

14. The 3D semiconductor memory device of claim 12, wherein the memory cell region further comprises pad regions arranged along the first direction, wherein each of the pad regions comprises the ends of the plurality of word lines arranged along a second direction crossing the first direction in plan view, wherein the pad regions are classified into a plurality of pad groups, and wherein the plurality of pad groups correspond to the plurality of main groups, respectively.

15. The 3D semiconductor memory device of claim 14, wherein the memory cell region further comprises contact plugs connected to the ends of the plurality of word lines, respectively, and wherein the contact plugs are arranged along the first direction in a plan view.

16. The 3D semiconductor memory device of claim 14, wherein corresponding the ends of the plurality of word lines and the plurality of main pass transistors overlap along the vertical direction.

17. The 3D semiconductor memory device of claim 11, wherein a width of each of the plurality of main pass transistors along the first direction is smaller than a protrusion width of an end of a second word line that protrudes along the first direction from an end of an immediately adjacent first word line.

18. The 3D semiconductor memory device of claim 11, wherein the plurality of main pass transistors is classified into a plurality of main groups, and wherein some of the plurality of main groups are arranged immediately adjacent to each other along the first direction.

19. A three-dimensional (3D) semiconductor memory device comprising:

a memory cell region; and a peripheral circuit region configured to control the memory cell region, wherein the memory cell region comprises a plurality of blocks, wherein each of the plurality of blocks comprises a cell array region comprising:

a plurality of memory cells arranged along a vertical direction; and a connection region comprising ends of a plurality of word lines that are connected to the plurality of memory cells, wherein the peripheral circuit region comprises peripheral circuit regions overlapping, respectively, with the connection region of the plurality of blocks, wherein each of the peripheral circuit regions comprises a plurality of main pass transistors electrically connected to the plurality of word lines, and a plurality of dummy pass transistors electrically separated from the plurality of word lines, and wherein the plurality of main pass transistors is arranged along a first direction perpendicular to the vertical direction.

20. The 3D semiconductor memory device of claim 19, wherein a width of each of the plurality of main pass transistors along the first direction is smaller than a protrusion width of an end of a second word line that protrudes along the first direction from an end of an immediately adjacent first word line.

* * * * *